(12) United States Patent
Baek et al.

(10) Patent No.: US 10,091,042 B2
(45) Date of Patent: *Oct. 2, 2018

(54) APPARATUS AND METHOD FOR SENDING AND RECEIVING BROADCAST SIGNALS

(71) Applicant: LG ELECTRONICS INC., Seoul (KR)

(72) Inventors: Jongseob Baek, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/646,938

(22) Filed: Jul. 11, 2017

(65) Prior Publication Data

US 2017/0373905 A1 Dec. 28, 2017

Related U.S. Application Data

(63) Continuation of application No. 14/837,542, filed on Aug. 27, 2015, now Pat. No. 9,735,995.

(Continued)

(51) Int. Cl.
*H04L 27/26* (2006.01)
*H03M 13/11* (2006.01)
(Continued)

(52) U.S. Cl.
CPC ..... *H04L 27/2649* (2013.01); *H03M 13/1165* (2013.01); *H03M 13/255* (2013.01); *H03M 13/271* (2013.01); *H03M 13/2778* (2013.01); *H03M 13/2792* (2013.01); *H03M 13/2906* (2013.01); *H04L 1/0041* (2013.01);
(Continued)

(58) Field of Classification Search
CPC . H04L 1/0071; H04L 1/0041; H04L 27/2626; H04L 5/0023; H04L 27/2627; H04L 1/004; H04L 1/0042; H04L 1/0618; H04L 27/12; H04L 1/0058; H04L 5/0007;
(Continued)

(56) References Cited

U.S. PATENT DOCUMENTS

| 13,432,881 | 4/2013 | Ko et al. |
| 9,008,218 B2 | 4/2015 | Ko et al. |

(Continued)

FOREIGN PATENT DOCUMENTS

| EP | 2472751 A1 | 7/2010 |
| EP | 2490391 A2 | 8/2012 |

(Continued)

*Primary Examiner* — Phung M Chung
(74) *Attorney, Agent, or Firm* — Dentons US LLP

(57) ABSTRACT

A broadcast signal transmitter is disclosed. A broadcast signal transmitter according to an embodiment of the present invention comprises an input formatting module configured to perform baseband formatting and to output at least one PLP (Physical Layer Pipe) data; a BICM (Bit Interleaved Coded Modulation) module configured to perform an error correction process on the PLP data; a framing and interleaving module configured to interleave the PLP data and to generate a signal frame; and a waveform generating module configured to generate a broadcast signal by inserting a preamble into the signal frame and performing OFDM modulation.

10 Claims, 46 Drawing Sheets

Related U.S. Application Data

(60) Provisional application No. 62/108,014, filed on Jan. 26, 2015, provisional application No. 62/108,551, filed on Jan. 28, 2015, provisional application No. 62/138,375, filed on Mar. 25, 2015.

(51) Int. Cl.
| | | |
|---|---|---|
| *H04L 1/00* | (2006.01) | |
| *H04L 29/08* | (2006.01) | |
| *H03M 13/27* | (2006.01) | |
| *H04L 5/00* | (2006.01) | |
| *H04L 29/06* | (2006.01) | |
| *H03M 13/29* | (2006.01) | |
| *H03M 13/25* | (2006.01) | |
| *H04L 12/18* | (2006.01) | |
| *H03M 13/15* | (2006.01) | |
| *H03M 13/09* | (2006.01) | |

(52) U.S. Cl.
CPC .......... *H04L 1/0048* (2013.01); *H04L 1/0071* (2013.01); *H04L 5/0048* (2013.01); *H04L 12/189* (2013.01); *H04L 27/2613* (2013.01); *H04L 27/2626* (2013.01); *H04L 27/2647* (2013.01); *H04L 27/2675* (2013.01); *H04L 69/22* (2013.01); *H04L 69/323* (2013.01); *H03M 13/09* (2013.01); *H03M 13/152* (2013.01); *H04L 1/0057* (2013.01); *H04L 2001/0093* (2013.01)

(58) Field of Classification Search
CPC .............. H04L 65/4076; H04L 1/0061; H03M 13/1165; H03M 13/27
See application file for complete search history.

(56) References Cited

U.S. PATENT DOCUMENTS

| | | | |
|---|---|---|---|
| 9,515,863 B2 | 12/2016 | Baek et al. | |
| 9,735,995 B2* | 8/2017 | Baek | H03M 13/2792 |
| 9,832,061 B2 | 11/2017 | Baek et al. | |
| 2008/0002566 A1* | 1/2008 | Zhang | H04L 27/2613 370/208 |
| 2009/0190677 A1 | 6/2009 | Jokela et al. | |
| 2009/0201516 A1* | 8/2009 | Takahashi | G09G 5/006 358/1.9 |
| 2009/0213853 A1* | 8/2009 | Kwon | H04H 20/93 370/389 |
| 2010/0251078 A1 | 9/2010 | Yokokawa et al. | |
| 2011/0274204 A1 | 11/2011 | Ko et al. | |
| 2012/0224659 A1 | 9/2012 | Yu et al. | |
| 2013/0117624 A1 | 5/2013 | Nicolas et al. | |
| 2013/0219431 A1 | 8/2013 | Hong et al. | |
| 2014/0229804 A1 | 8/2014 | Hong et al. | |
| 2014/0301252 A1 | 10/2014 | Choi et al. | |
| 2016/0173233 A1 | 6/2016 | Loghin et al. | |
| 2016/0218748 A1 | 7/2016 | Baek et al. | |
| 2016/0226689 A1 | 8/2016 | Kim et al. | |
| 2016/0226694 A1 | 8/2016 | Kim et al. | |
| 2016/0381518 A1 | 12/2016 | Kim et al. | |
| 2017/0006355 A1 | 1/2017 | Kim et al. | |
| 2017/0019285 A1 | 1/2017 | Baek et al. | |

FOREIGN PATENT DOCUMENTS

| | | |
|---|---|---|
| KR | 10-2009-0074695 A | 7/2009 |
| KR | 10-2013-0121881 A | 11/2013 |
| WO | 2010/071273 A1 | 6/2010 |

* cited by examiner

FIG. 12

| Content | Bits |
|---|---|
| PHY_PROFILE | 3 |
| FFT_SIZE | 2 |
| GI_FRACTION | 3 |
| EAC_FLAG | 1 |
| POLOT_MODE | 1 |
| PAPR_FLAG | 1 |
| FRU_CONFIGURE | 3 |
| RESERVED | 7 |

FIG. 13

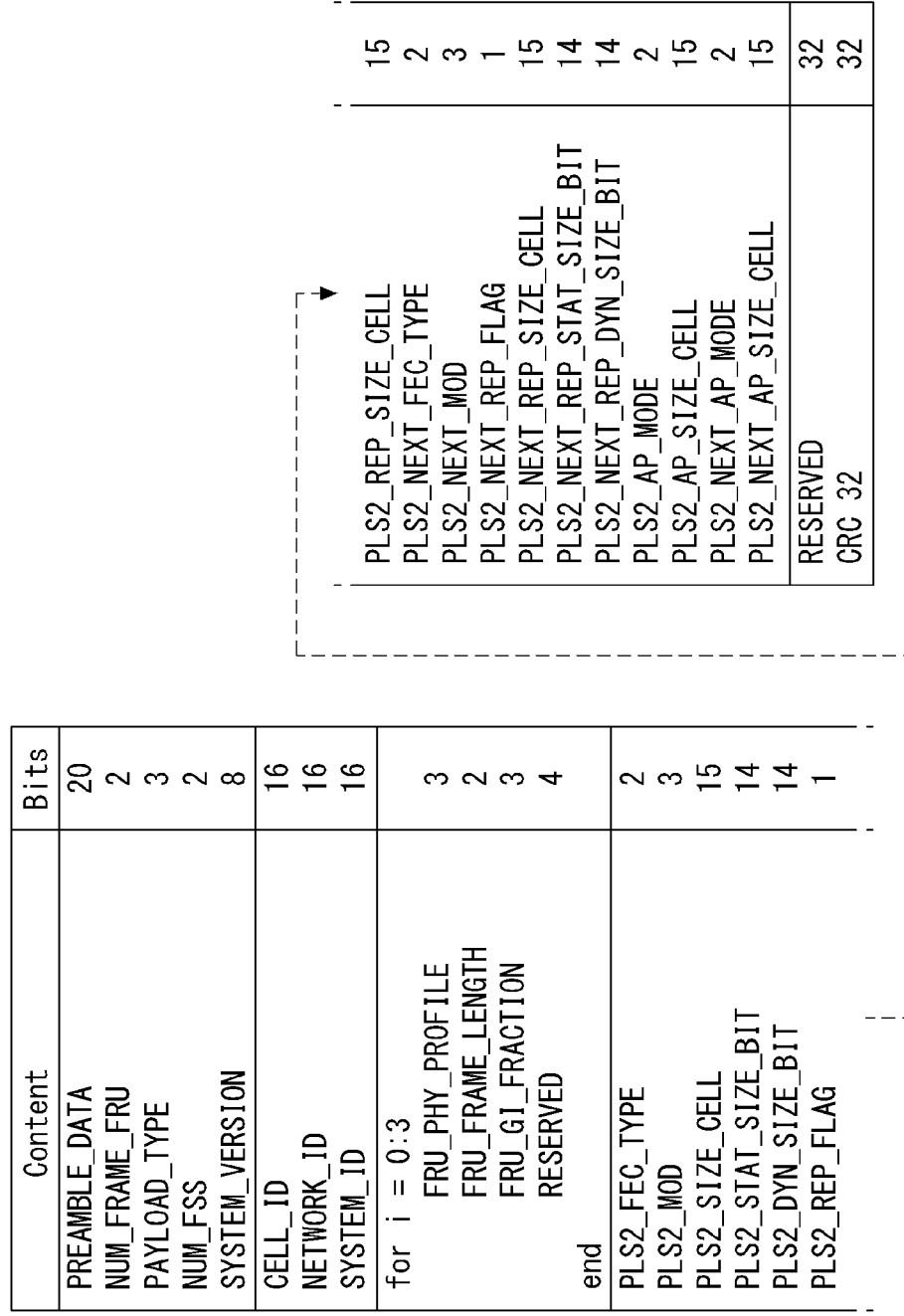

| Content | Bits |
|---|---|
| PREAMBLE_DATA | 20 |
| NUM_FRAME_FRU | 2 |
| PAYLOAD_TYPE | 3 |
| NUM_FSS | 2 |
| SYSTEM_VERSION | 8 |
| CELL_ID | 16 |
| NETWORK_ID | 16 |
| SYSTEM_ID | 16 |
| for i = 0:3 | |
|     FRU_PHY_PROFILE | 3 |
|     FRU_FRAME_LENGTH | 2 |
|     FRU_G1_FRACTION | 3 |
|     RESERVED | 4 |
| end | |
| PLS2_FEC_TYPE | 2 |
| PLS2_MOD | 3 |
| PLS2_SIZE_CELL | 15 |
| PLS2_STAT_SIZE_BIT | 14 |
| PLS2_DYN_SIZE_BIT | 14 |
| PLS2_REP_FLAG | 1 |
| PLS2_REP_SIZE_CELL | 15 |
| PLS2_NEXT_FEC_TYPE | 2 |
| PLS2_NEXT_MOD | 3 |
| PLS2_NEXT_REP_FLAG | 1 |
| PLS2_NEXT_REP_SIZE_CELL | 15 |
| PLS2_NEXT_REP_STAT_SIZE_BIT | 14 |
| PLS2_NEXT_REP_DYN_SIZE_BIT | 14 |
| PLS2_AP_MODE | 2 |
| PLS2_AP_SIZE_CELL | 15 |
| PLS2_NEXT_AP_MODE | 2 |
| PLS2_NEXT_AP_SIZE_CELL | 15 |
| RESERVED | 32 |
| CRC_32 | 32 |

FIG. 14

| Content | Bit |
|---|---|
| FIC_FLAG | 1 |
| AUX_FLAG | 1 |
| NUM_DP | 6 |
| for i = NUM_DP | |
| DP_ID | 6 |
| DP_TYPE | 3 |
| DP_GROUP_ID | 8 |
| BASE_DP_ID | 6 |
| DP_FEC_TYPE | 2 |
| DP_COD | 4 |
| DP_MOD | 4 |
| DP_SSD_FLAG | 1 |
| if PHY_PROFILE = '010' | |
| DP_MIMO | 3 |
| end | |
| DP_TI_TYPE | 1 |
| DP_TI_LENGTH | 2 |
| DP_TI_BYPASS | 1 |
| DP_FRAME_INTERVAL | 2 |
| DP_FIRST_FRAME_IDX | 5 |
| DP_NUM_BLOCK_MAX | 10 |
| DP_PAYLOAD_TYPE | 2 |
| DP_INBAND_MODE | 2 |
| DP_PROTOCOL_TYPE | 2 |
| DP_CRC_MODE | 2 |
| if DP_PAYLOAD_TYPE==TS('00') | |
| DNP_MODE | 2 |
| ISSY_MODE | 2 |
| HC_MODE_TS | 2 |
| if HC_MODE_TS=='01' or '10' | |
| PID | 13 |
| end | |
| if DP_PAYLOAD_TYPE==IP('01') | |
| HC_MODE_IP | 2 |
| end | |
| RESERVED | 8 |
| end | |
| if FIC_FLAG == 1 | |
| FIC_VERSION | 8 |
| FIC_LENGTH_BYTE | 13 |
| RESERVED | 8 |
| end | |
| if AUX_FLAG == 1 | |
| NUM_AUX | 4 |
| AUX_CONFIG_RFU | 8 |
| for i=1:NUM_AUX | |
| AUX_STREAM_TYPE | 4 |
| AUX_PRIVATE_CONF | 28 |
| end | |

FIG. 15

| Content | Bit |
|---|---|
| FRAME_INDEX | 5 |
| PLS_CHANGE_COUNTER | 4 |
| FIC_CHANGE_COUNTER | 4 |
| RESERVED | 16 |
| for i = 1:NUM_DP | |
|     DP_ID | 6 |
|     DP_START | 15(or 13) |
|     DP_NUM_BLOCK | 10 |
|     RESERVED | 8 |
| end | |
| EAC_FLAG | 1 |
| EAS_WAKE_UP_VERSION_NUM | 8 |
| if EAC_FLAG == 1 | |
|     EAC_LENGTH_BYTE | 12 |
| else | |
|     EAC_COUNTER | 12 |
| end | |
| for i = 1:NUM_AUX | |
|     AUX_PRIVATE_DYN | 48 |
| end | |
| CRC 32 | 32 |

FIG. 29

Dummy cells are skipped during reading processing

FIG. 41

| Configurable signaling | Dynamic signaling |
|---|---|

```
for i=0:NUM_PLP-1 {
  if NUM_PLP=1 {
    TI_START_ROW          (x bits), i.e., 10 bits
    TI_FECBLOCK_IDX       (x bits), i.e., 10 bits
    TI_FECBLOCK_START }   (x bits), i.e., 15/16 bits
  else {
    PLP_NUM_BLOCKS }      (x bits), i.e., 10 bit
}
```

Single-PLP: TI_START_ROW, TI_FECBLOCK_IDX, TI_FECBLOCK_START
Multiple-PLP: PLP_NUM_BLOCKS

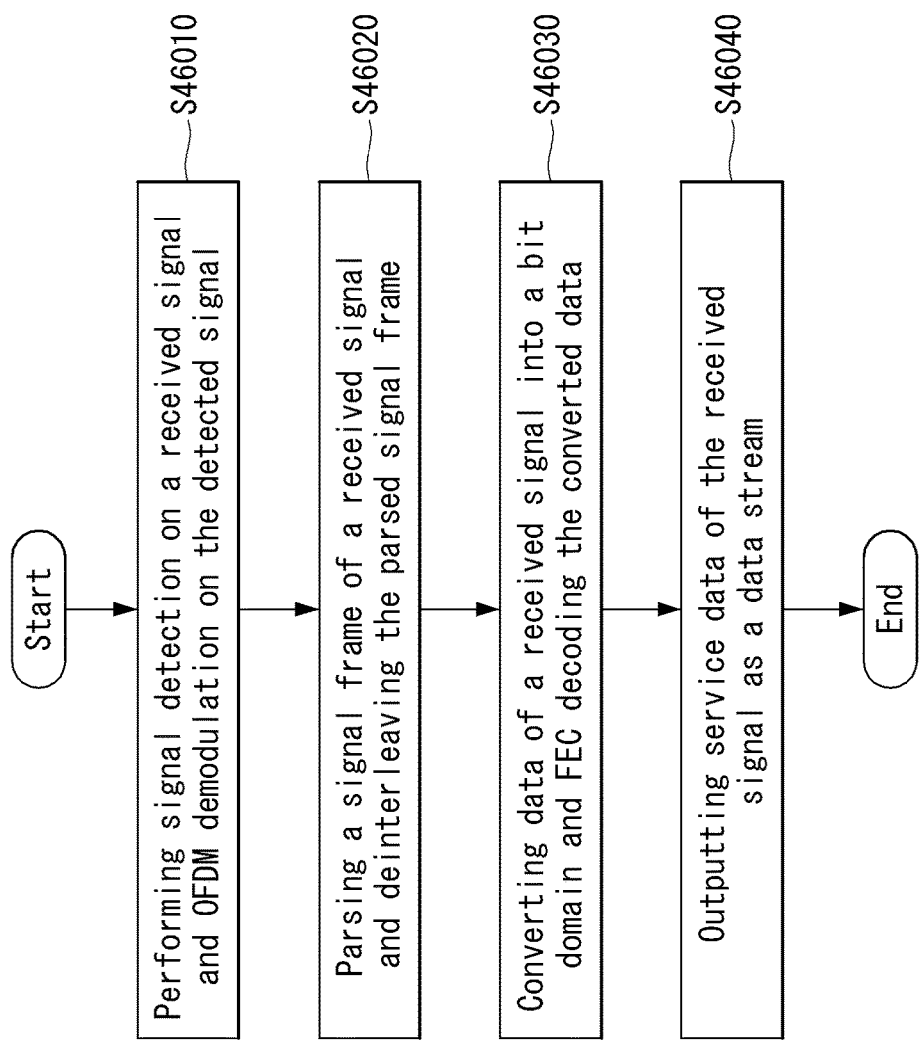

APPARATUS AND METHOD FOR SENDING AND RECEIVING BROADCAST SIGNALS

CROSS-REFERENCE TO RELATED APPLICATIONS

This application is a continuation application of U.S. patent application Ser. No. 14/837,542 filed on Aug. 27, 2015, which claims the benefit of and priority to Provisional Application Nos. 62/108,014 filed Jan. 26, 2015, 62/108,551 filed Jan. 28, 2015, and 62/138,375 filed Mar. 25, 2015, all of which are hereby incorporated by reference in their entirety.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

To solve the technical problem above, a broadcast signal transmitter according to an embodiment of the present invention comprises an input formatting module configured to perform baseband formatting and to output at least one Physical Layer Pipe (PLP) data; a Bit Interleaved Coded Modulation (BICM) module configured to perform an error correction process on the PLP data; a framing and interleaving module configured to interleave the PLP data and to generate a signal frame; and a waveform generating module configured to generate a broadcast signal by inserting a preamble into the signal frame and performing OFDM modulation, wherein the framing and interleaving module further comprises a time interleaving module configured to time interleave the PLP data and the preamble includes signaling information configuring physical layer parameters.

In a broadcast signal transmitter according to an embodiment of the present invention, the time interleaving module further comprises a cell-to-memory unit mapping module configured to map cells of the PLP data to memory units and the cell-to-memory unit mapping module maps two consecutive cells to each memory unit when the time interleaving module operates in an extended interleaving mode.

In a broadcast signal transmitter according to an embodiment of the present invention, the time interleaving module optionally operates in an extended interleaving mode when the PLP data is modulated by QPSK scheme.

In a broadcast signal transmitter according to an embodiment of the present invention, the signaling information includes Time Interleaving (TI) extended interleaving information indicating whether the extended interleaving mode is used for the PLP data.

In a broadcast signal transmitter according to an embodiment of the present invention, the time interleaving module further comprises a memory unit-to-cell demapping module configured to demap cells included in the memory units, wherein the memory unit-to-cell demapping module demaps a memory unit to which two consecutive cells are mapped to cells in case the time interleaving module operates in the extended interleaving mode.

A method for transmitting a broadcast signal according to an embodiment of the present invention comprises performing baseband formatting and outputting at least one Physical Layer Pipe (PLP) data; performing an error correction process on the PLP data; interleaving the PLP data and generating a signal frame; and generating a broadcast signal by inserting a preamble into the signal frame and performing OFDM modulation, wherein the interleaving PLP data and generating a signal frame further comprises performing time interleaving on the PLP data and the preamble includes signaling information configuring physical layer parameters.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

Further aspects and effects of the present invention will be described more detail with embodiments in belows.

BRIEF DESCRIPTION OF THE DRAWINGS

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 15 illustrates PLS2 data according to another embodiment of the present invention.

FIG. 29 illustrates XFECBLOCK interleaved from each interleaving array according to an exemplary embodiment of the present invention.

FIG. 41 illustrates TI signaling information according to another embodiment of the present invention.

FIG. 46 illustrates a method for receiving a broadcast signal of a broadcast signal receiver according to one embodiment of the present invention.

DETAILED DESCRIPTION OF THE EMBODIMENTS

Figure 1:
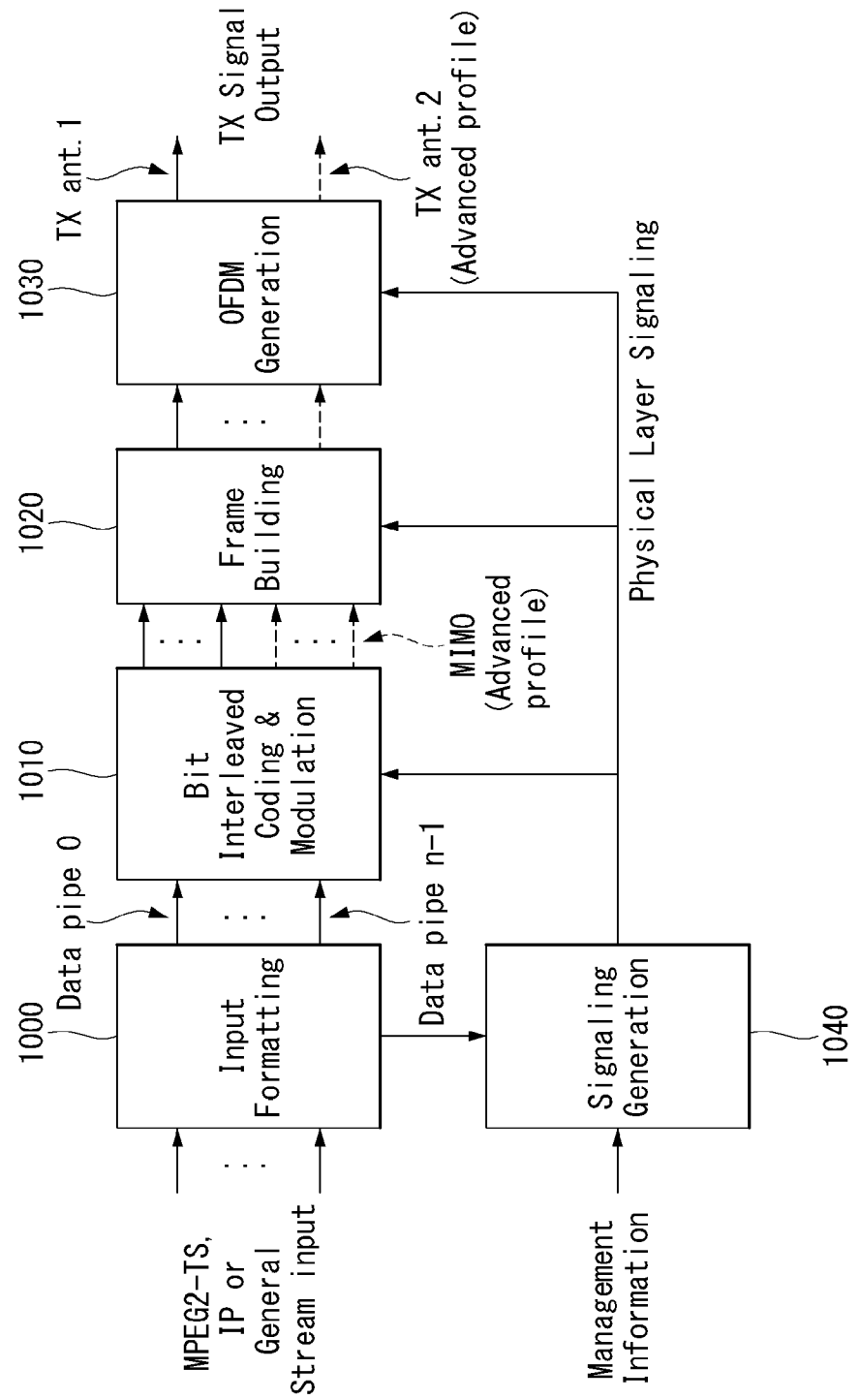
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings. Also, the term block and module are used similarly to indicate logical/functional unit of particular signal/data processing.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| LDPC codeword length | 16K, 64K bits |
|---|---|
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| LDPC codeword length | 16K bits |
|---|---|
| Constellation size | 2~8 bpcu |
| Time de-interleaving memory size | $\leq 2^{18}$ data cells |

TABLE 2-continued

| LDPC codeword length | 16K bits |
|---|---|
| Pilot patterns | Pilot patterns for mobile and indoor reception |
| FFT size | 8K, 16K points |

3. Advanced Profile

The advanced profile provides highest channel capacity at the cost of more implementation complexity.

This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| LDPC codeword length | 16K, 64K bits |
|---|---|
| Constellation size | 8~12 bpcu |
| Time de-interleaving memory size | $\leq 2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot(sp) pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to- Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
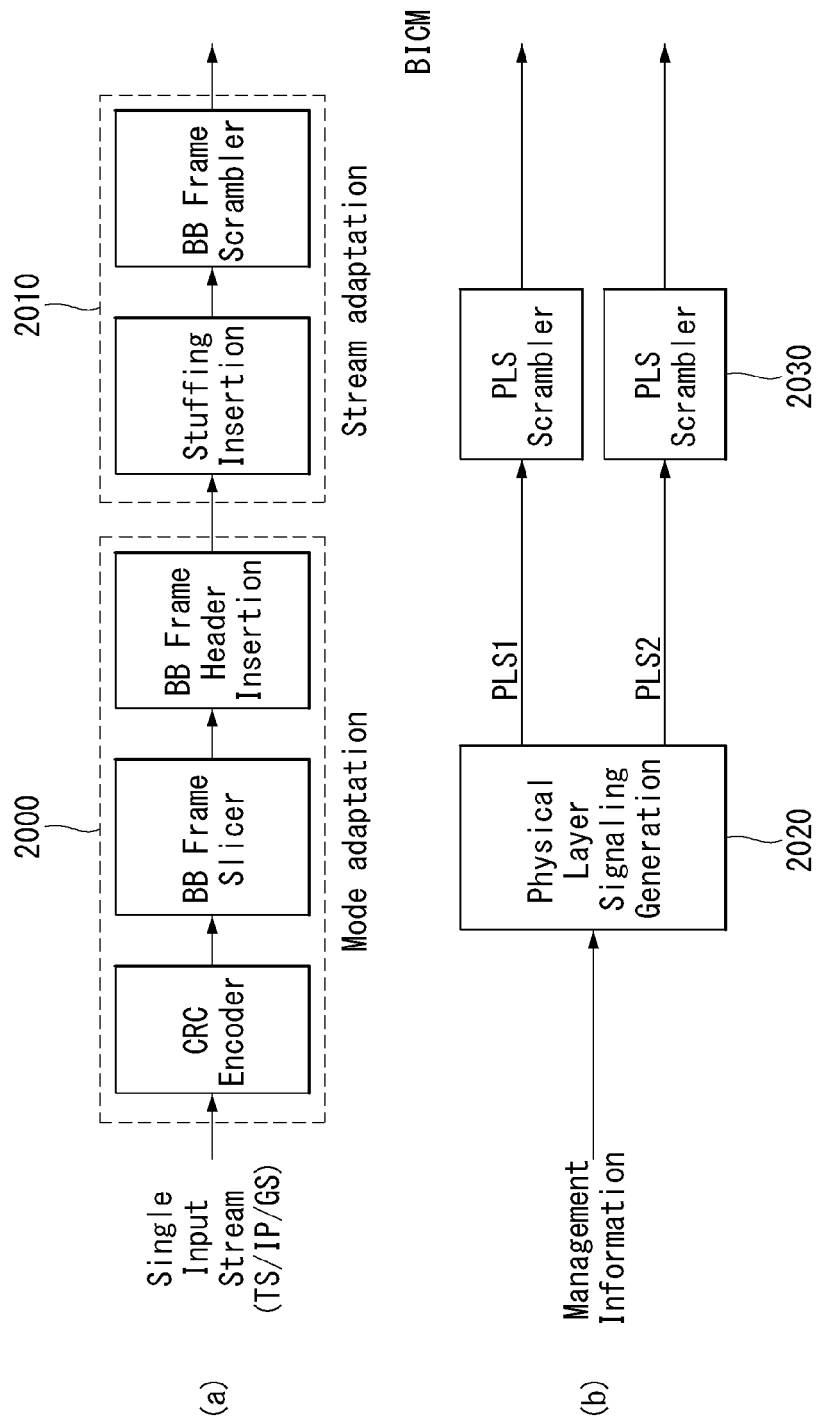
FIG. 2 illustrates an input formatting block according to one embodiment of the present invention.
Figure 3:
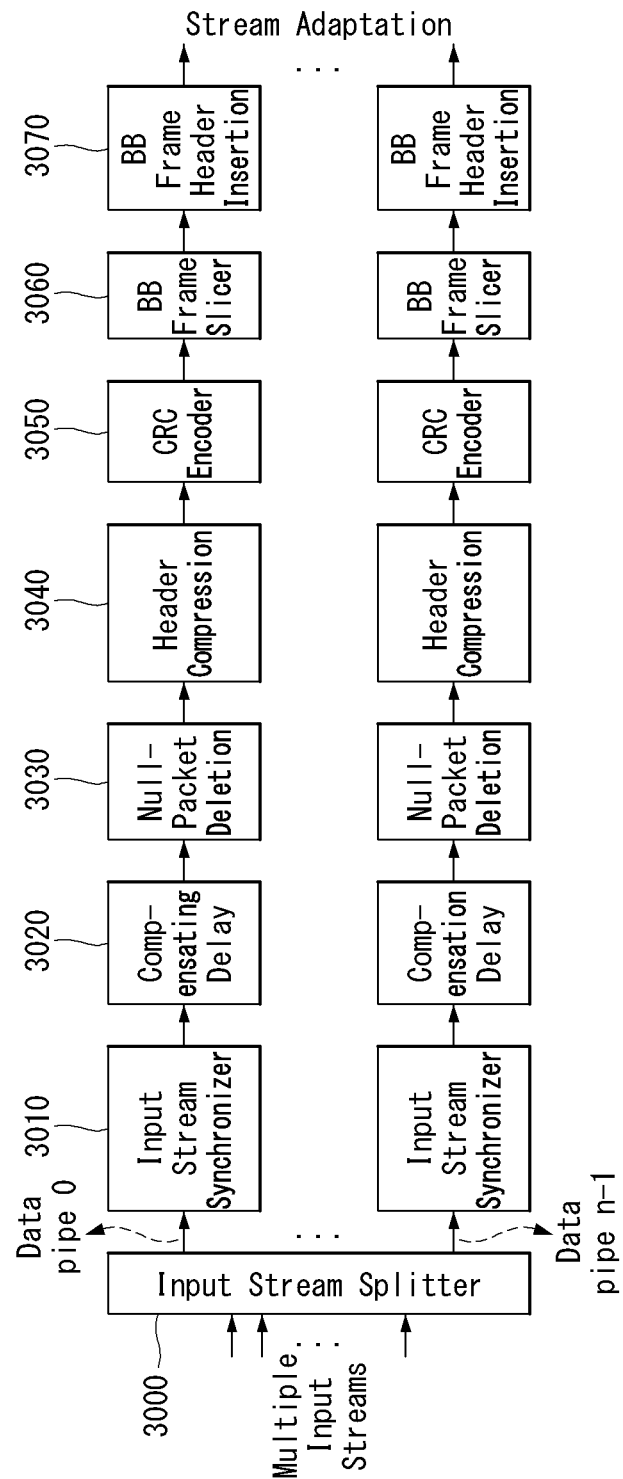
FIG. 3 illustrates an input formatting block according to another embodiment of the present invention.
Figure 4:
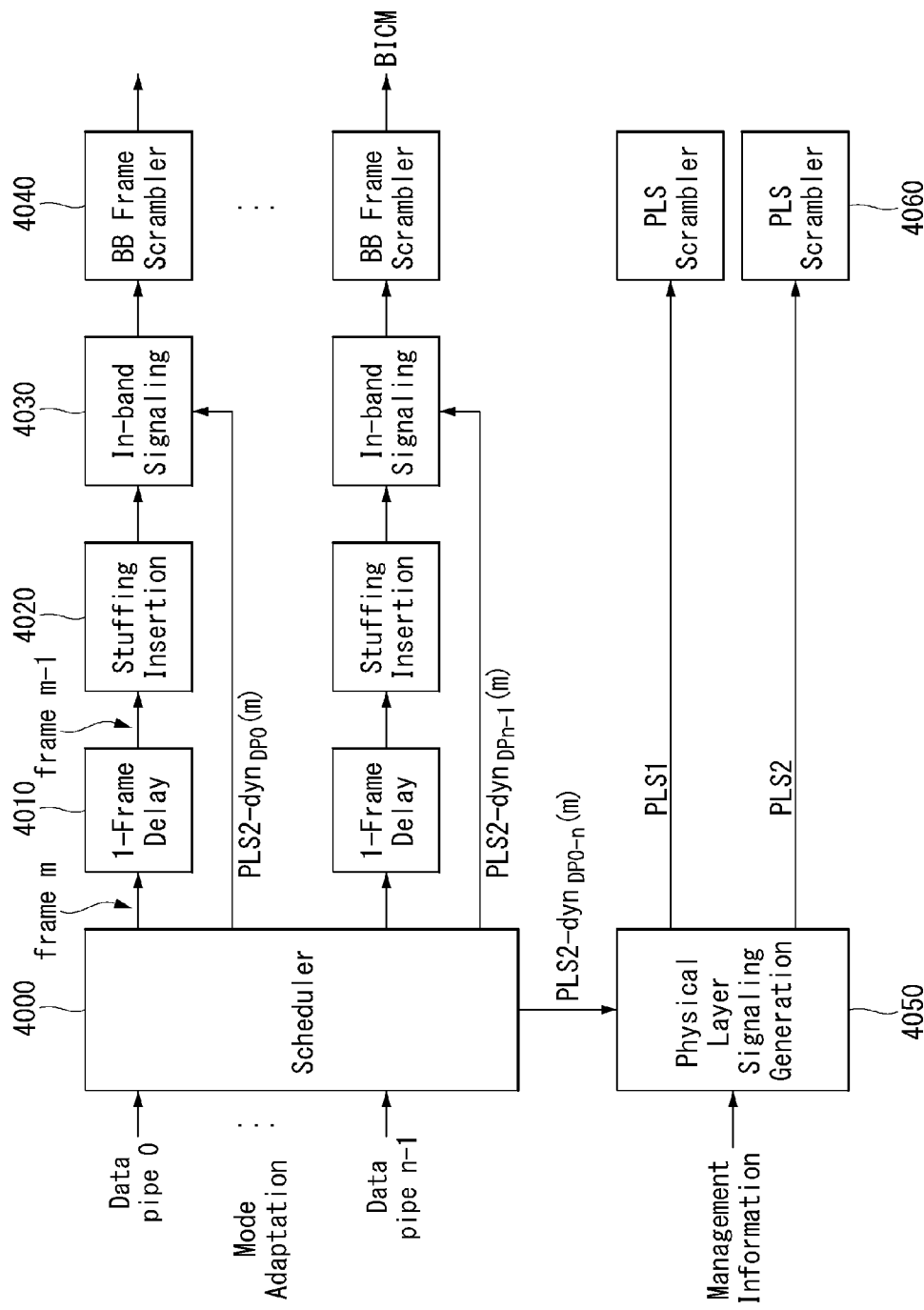
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
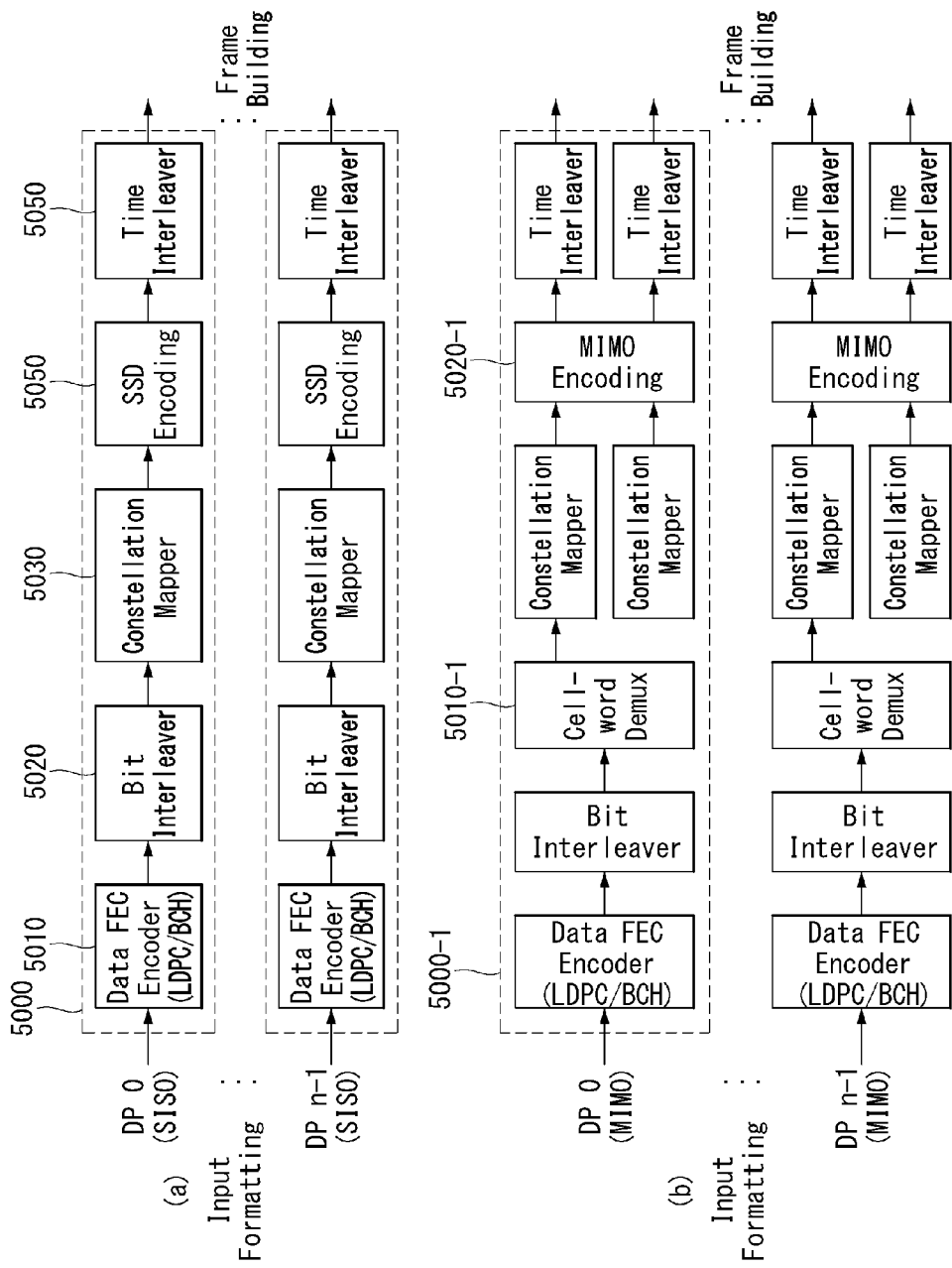
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
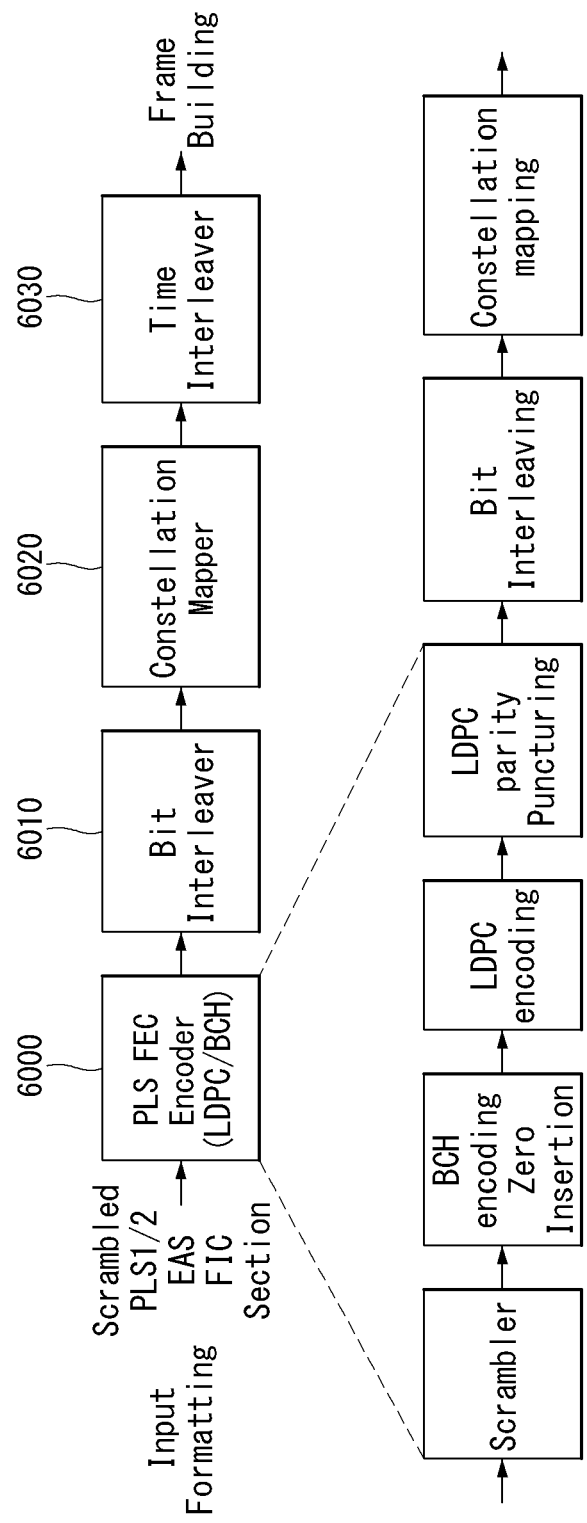
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Equation 1]

The LDPC code parameters for PLS1 and PLS2 are as following table 4.

TABLE 4

| Signaling Type | Ksig | Kbch | Nbch_parity | Kldpc (=Nbch) | Nldpc | Nldpc_parity | code rate | Qldpc |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit ineterlaeved PLS1 data and PLS2 data onto constellations.

The time interleaver 6030 can interleave the mapped PLS1 data and PLS2 data.

The above-described blocks may be omitted or replaced by blocks having similar or identical functions.

Figure 7:
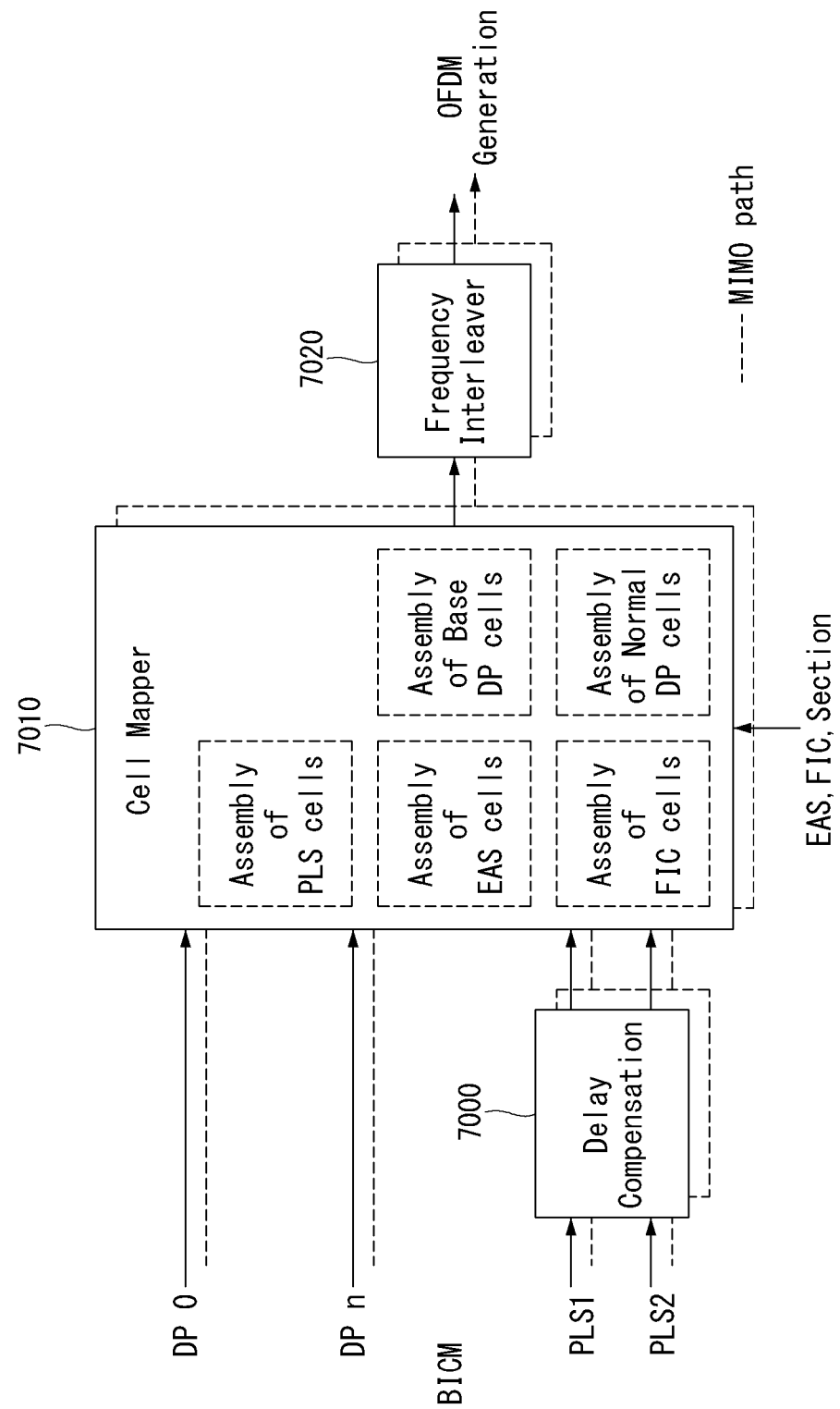
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

Figure 8:
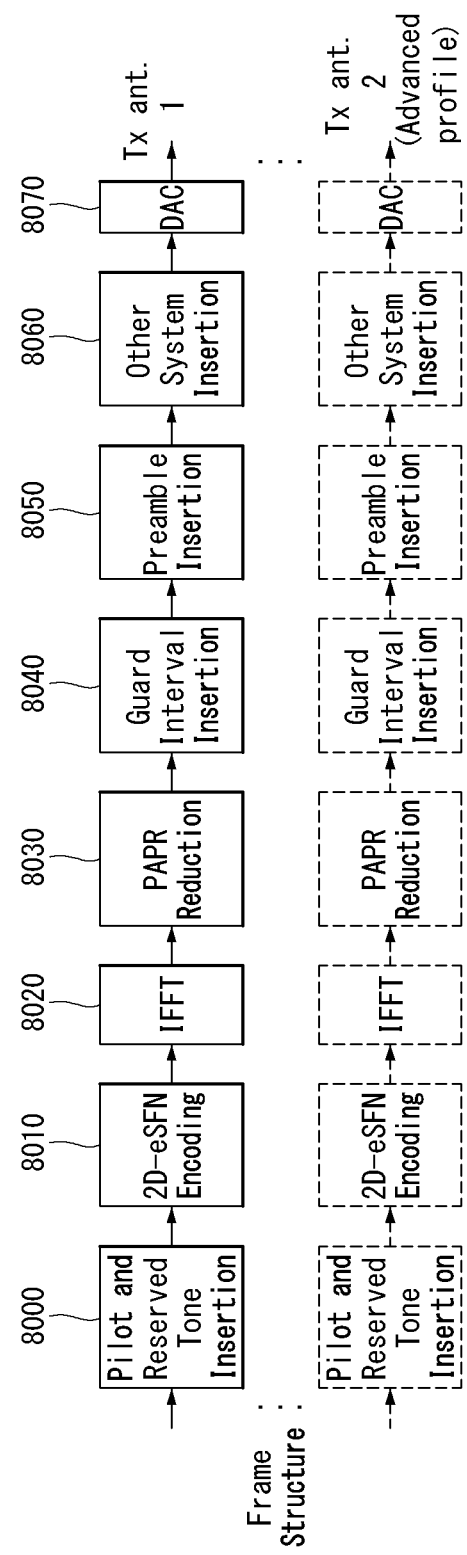
FIG. 8 illustrates an OFDM generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots (SP), continual pilots (CP), edge pilots (EP), FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
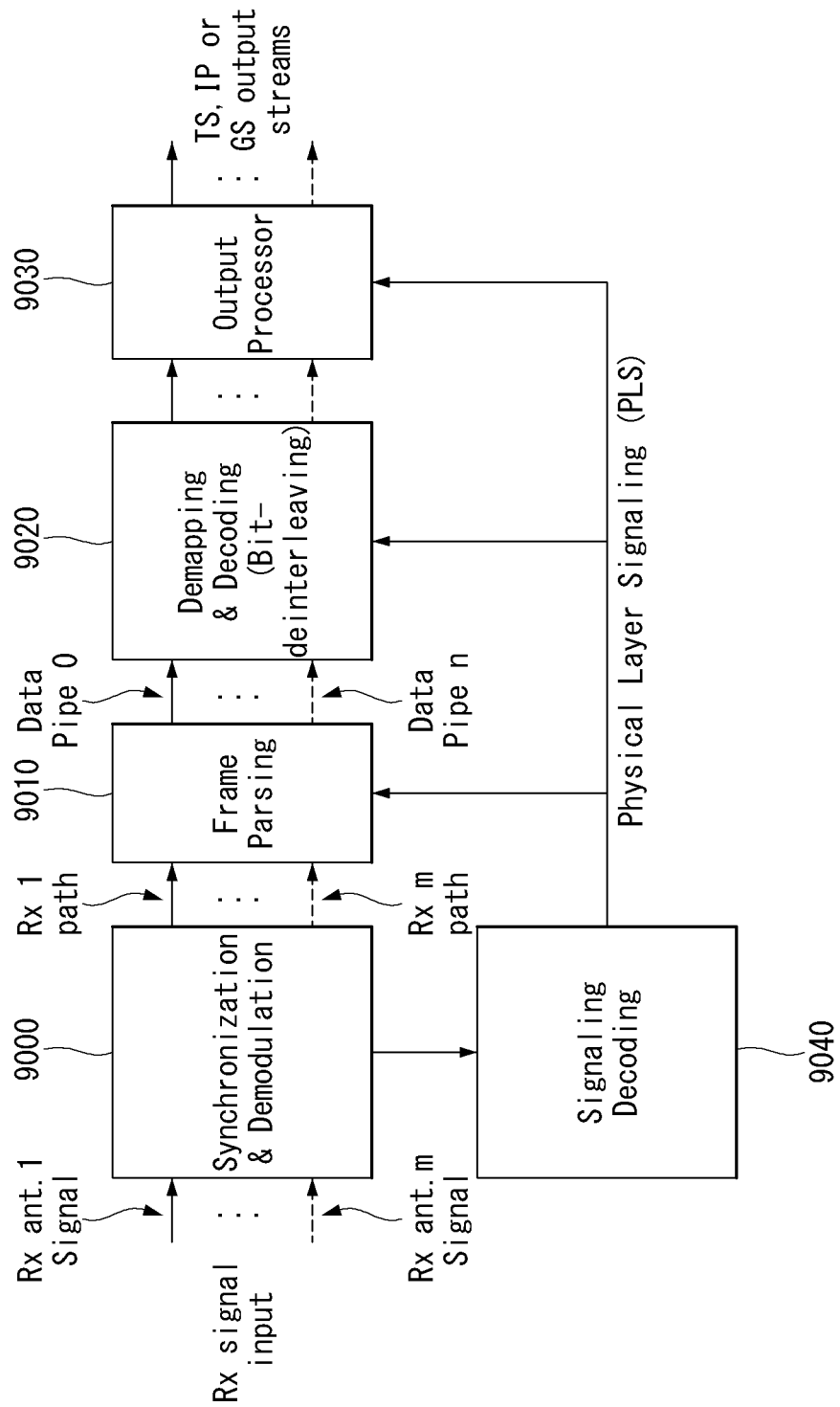
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9010 can parse input signal frames and extract data through which a service selected by a user is transmitted. If the apparatus for transmitting broadcast signals performs interleaving, the frame parsing module 9010 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9020 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9020 can obtain transmission parameters necessary for demapping and decoding by decoding the data output from the signaling decoding module 9040.

The output processor 9030 can perform reverse procedures of various compression/signal processing procedures which are applied by the apparatus for transmitting broadcast signals to improve transmission efficiency. In this case, the output processor 9030 can acquire necessary control information from data output from the signaling decoding module 9040. The output of the output processor 9030 corresponds to a signal input to the apparatus for transmitting broadcast signals and may be MPEG-TSs, IP streams (v4 or v6) and generic streams.

The signaling decoding module 9040 can obtain PLS information from the signal demodulated by the synchronization & demodulation module 9000. As described above, the frame parsing module 9010, demapping & decoding module 9020 and output processor 9030 can execute functions thereof using the data output from the signaling decoding module 9040.

Figure 10:
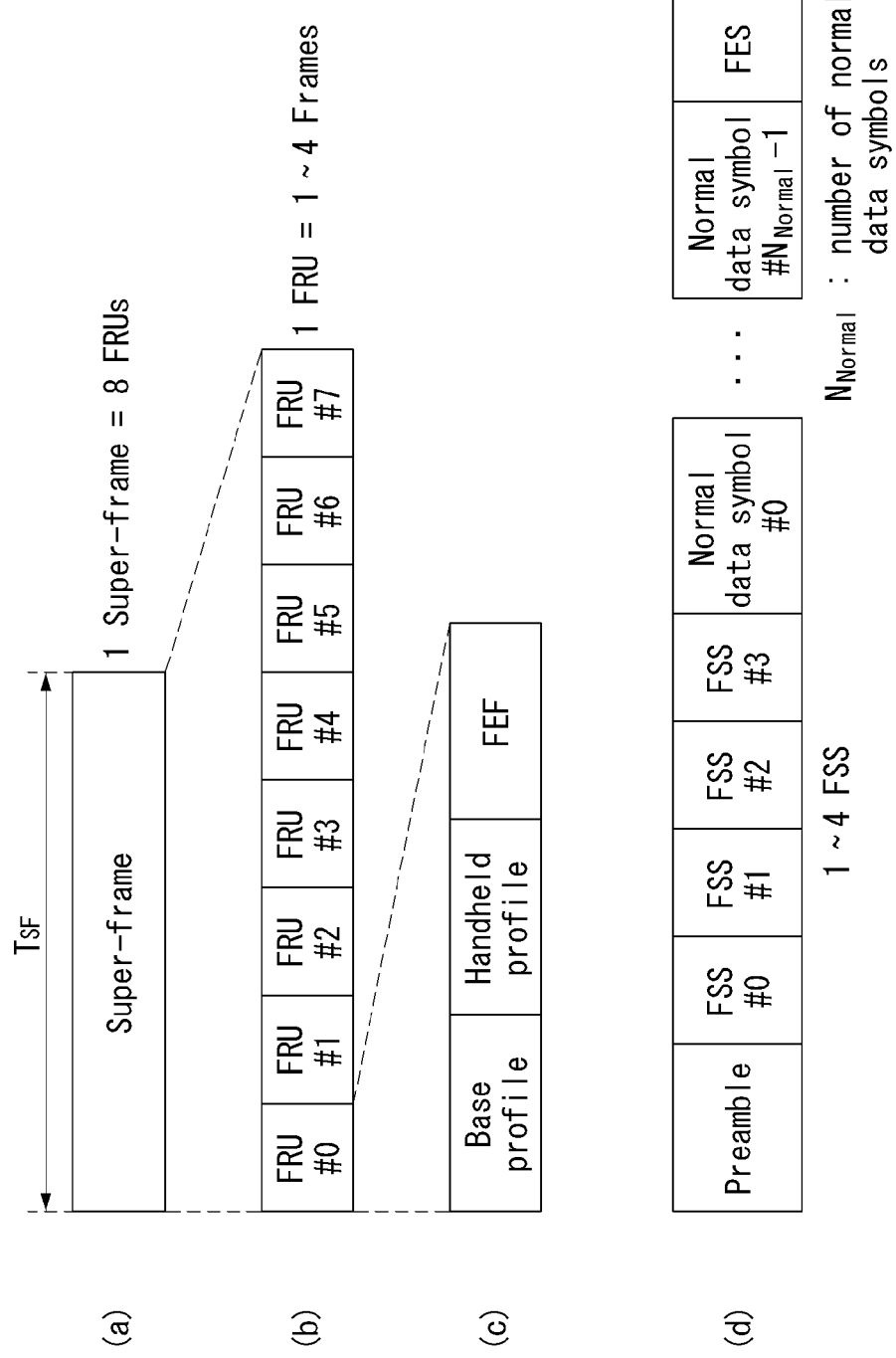
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

Figure 11:
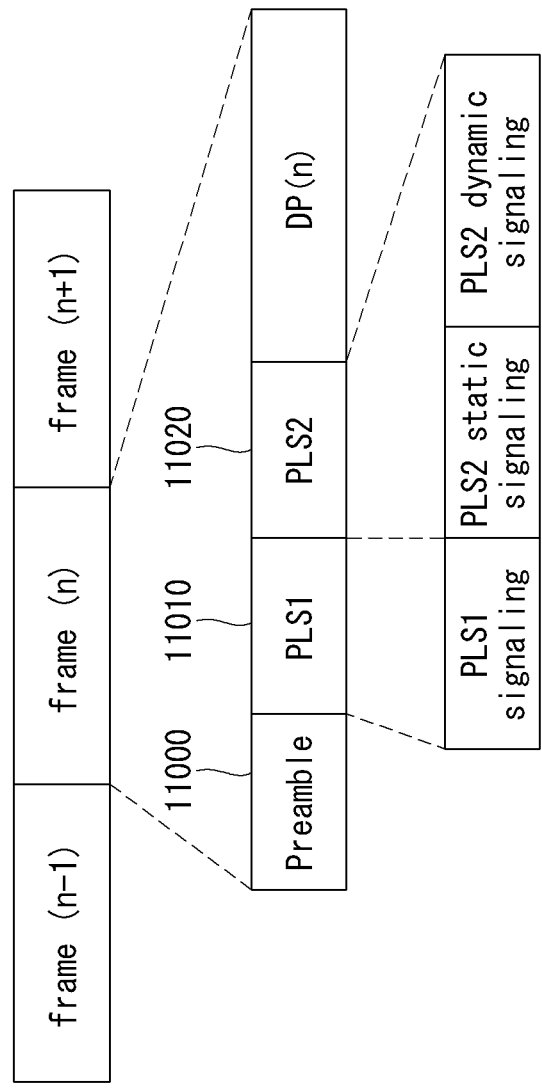
FIG. 11 illustrates a signaling hierarchy structure of the frame according to an embodiment of the present invention.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If this field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

|  | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| Value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Contents | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (Pi=1). The allowed PI values with 2-bit field are defined in the below table 18.

TABLE 18

| 2-bit field | PI | NTI |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |

TABLE 23-continued

| Value | Null-packet deletion mode |
|---|---|
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE IP: This 2-bit field indicates the IP header compression mode when DP_PAYLOAD_TYPE is set to IP ('01'). The HC_MODE IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.
The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use. The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:
FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.
The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| | DP_START field size | |
|---|---|---|
| PHY profile | 64K | 16K |
| Base | 13 bits | 15 bits |
| Handheld | — | 13 bits |
| Advanced | 13 bits | 15 bits |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.
The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

Figure 16:
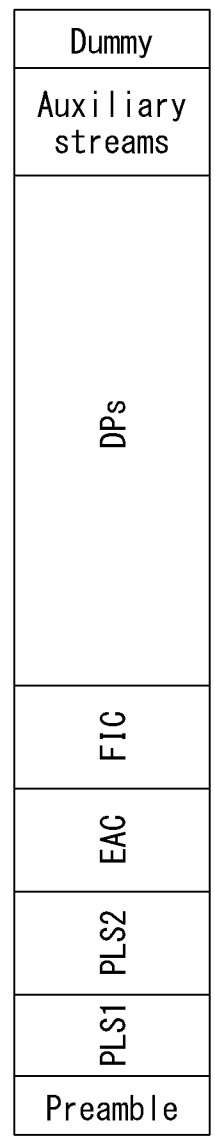
FIG. 16 illustrates a logical structure of a frame according to an embodiment of the present invention.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
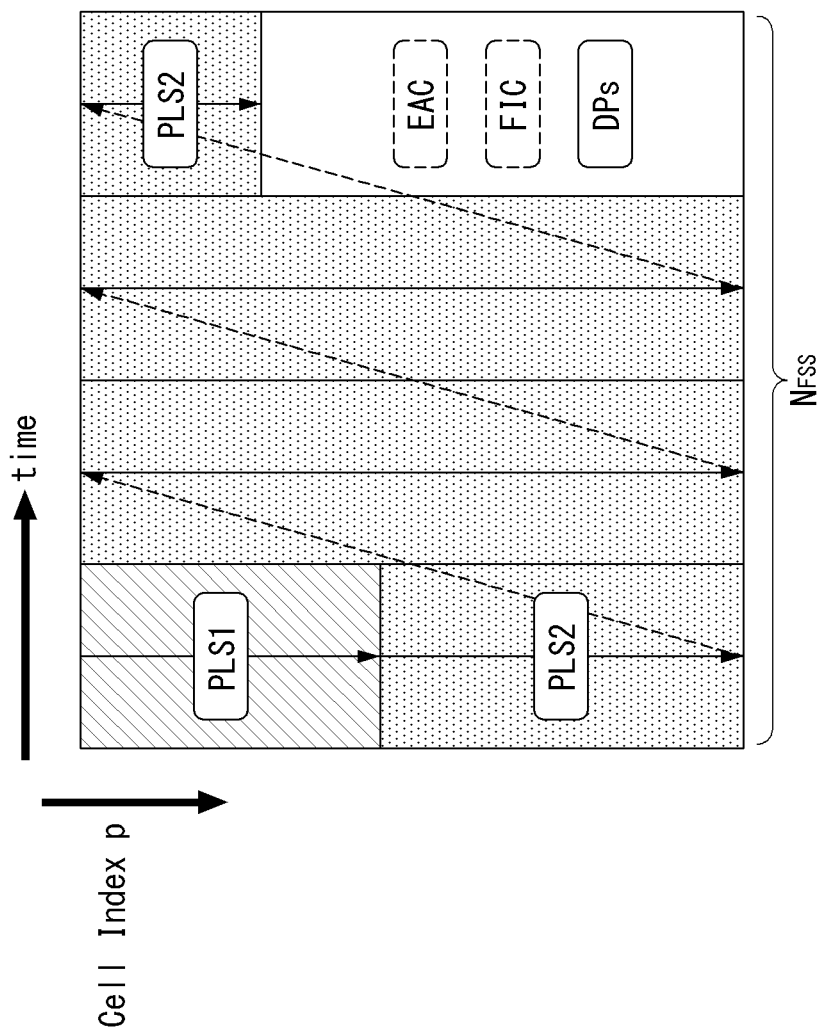
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) N_FSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
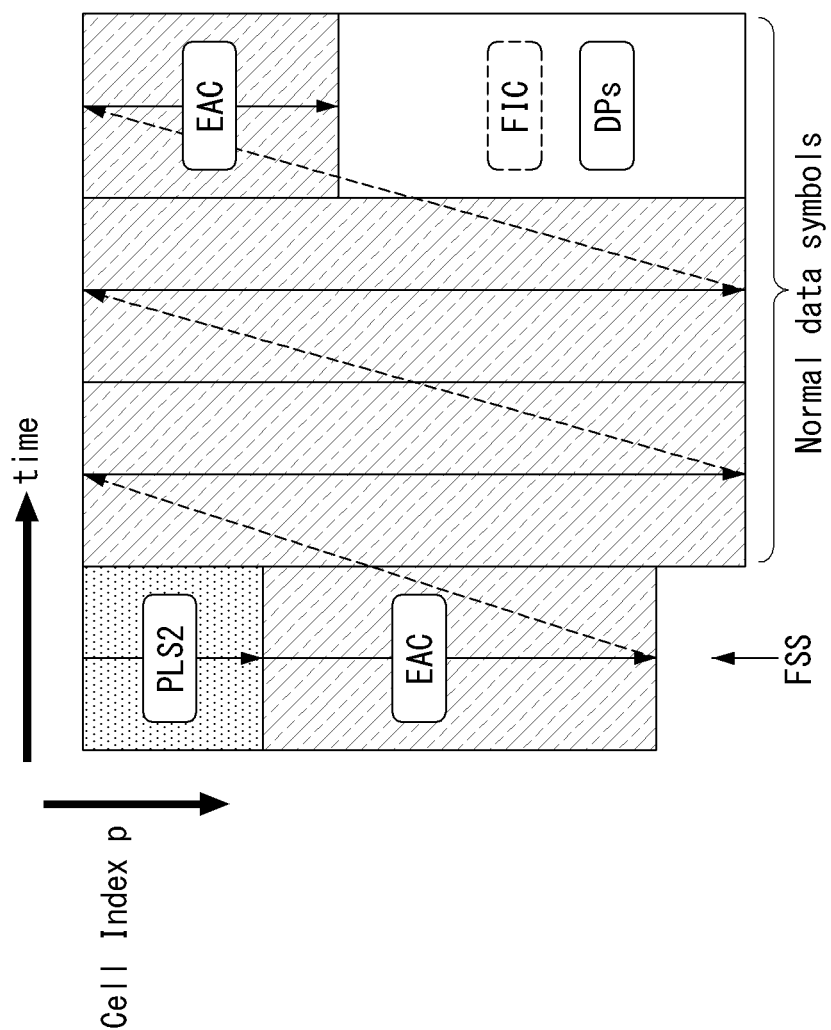
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
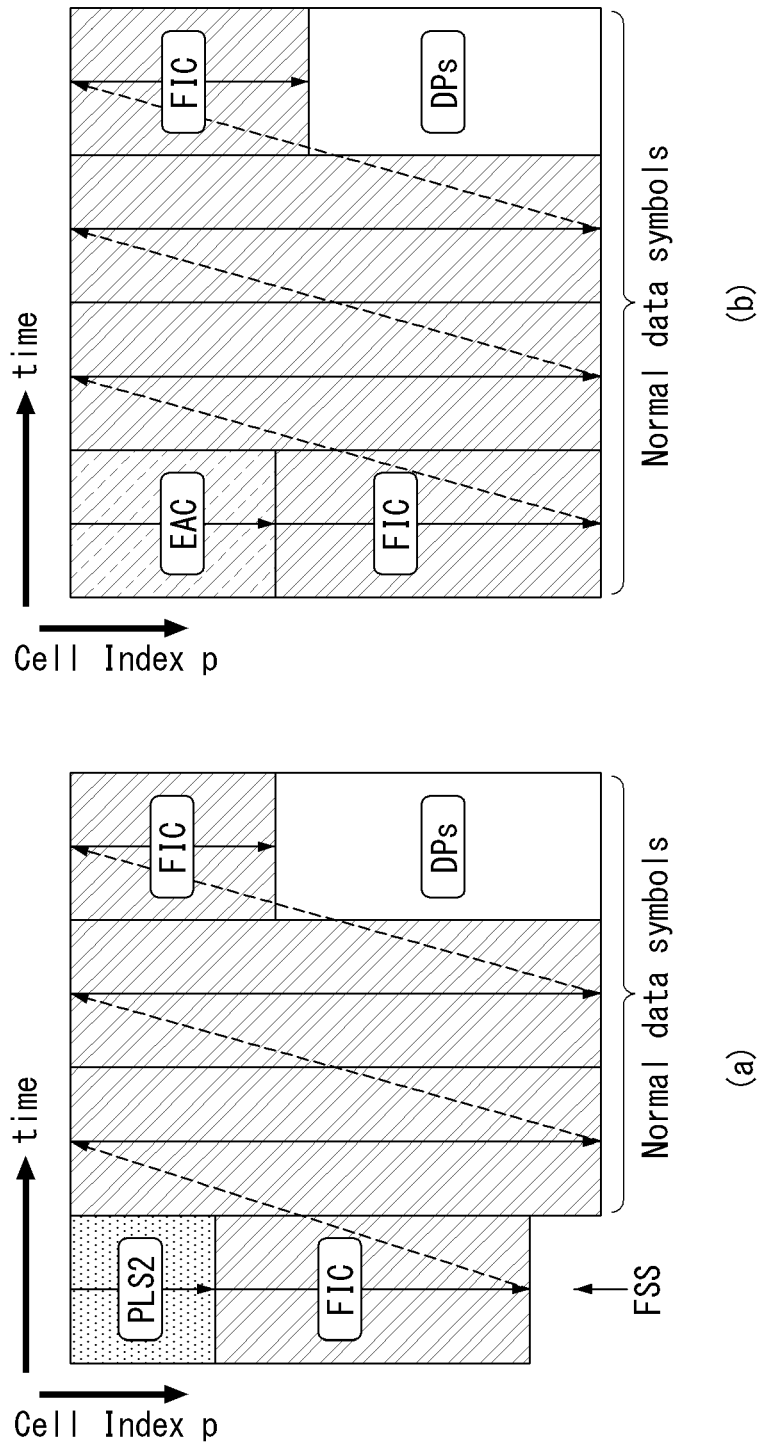
FIG. 19 illustrates FIC mapping according to an embodiment of the present invention.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
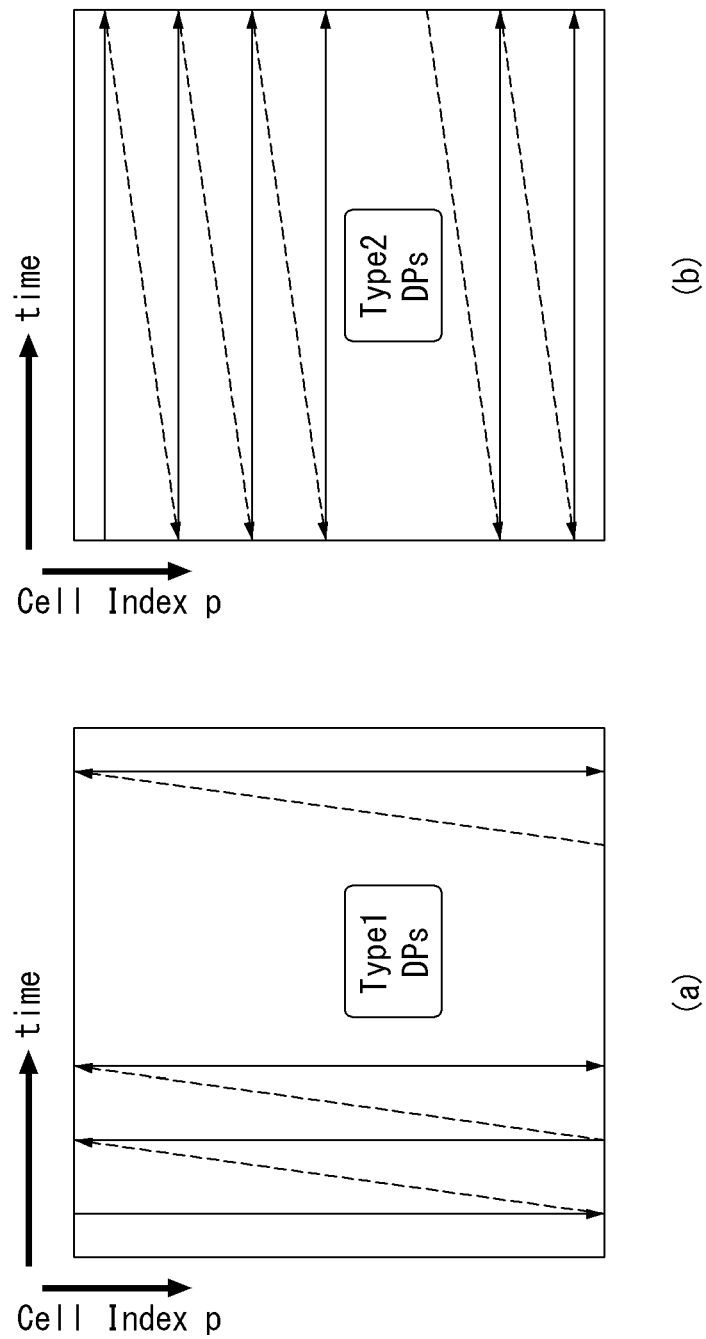
FIG. 20 illustrates a type of DP according to an embodiment of the present invention.

FIG. 20 illustrates a type of DP according to an embodiment of the present invention.

shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \le D_{DP} \quad \text{[Equation 2]}$$

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
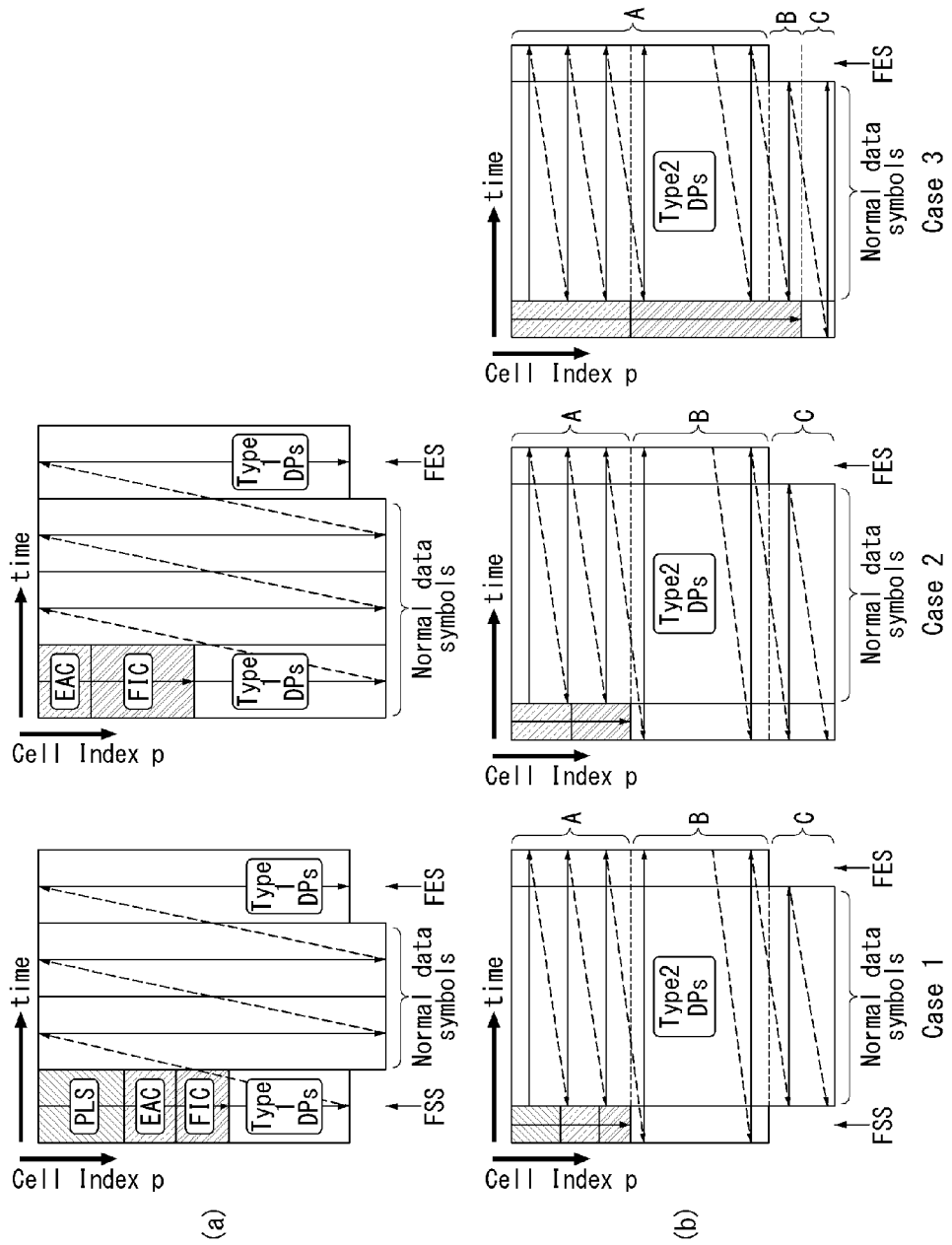
FIG. 21 illustrates DP mapping according to an embodiment of the present invention.

FIG. 21 illustrates DP mapping according to an embodiment of the present invention.

shows an addressing of OFDM cells for mapping type 1 DPs and (b) shows an addressing of OFDM cells for mapping for type 2 DPs.

Addressing of OFDM cells for mapping Type 1 DPs (0, . . . , DDP1−1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2−1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

Figure 22:
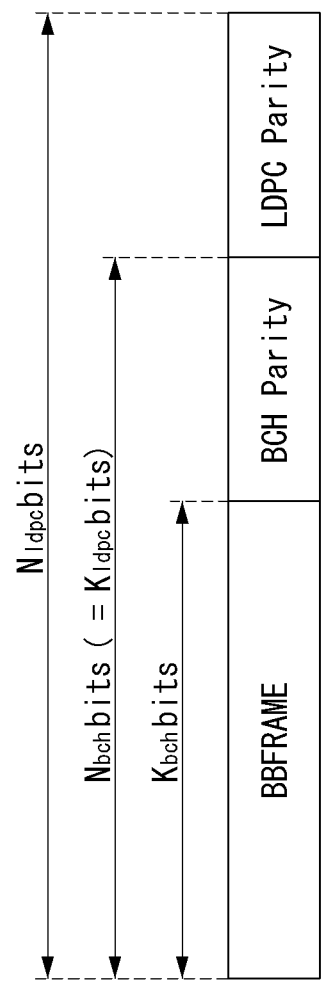
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | Nldpc | Kldpc | Kbch | BCH error correction capability | Nbch-Kbch |
|---|---|---|---|---|---|
| 5/15 | 64800 | 21600 | 21408 | 12 | 192 |
| 6/15 |  | 25920 | 25728 |  |  |
| 7/15 |  | 30240 | 30048 |  |  |
| 8/15 |  | 34560 | 34368 |  |  |
| 9/15 |  | 38880 | 38688 |  |  |
| 10/15 |  | 43200 | 43008 |  |  |
| 11/15 |  | 47520 | 47328 |  |  |
| 12/15 |  | 51840 | 51648 |  |  |
| 13/15 |  | 56160 | 55968 |  |  |

TABLE 29

| LDPC Rate | Nldpc | Kldpc | Kbch | BCH error correction capability | Nbch-Kbch |
|---|---|---|---|---|---|
| 5/15 | 16200 | 5400 | 5232 | 12 | 168 |
| 6/15 |  | 6480 | 6312 |  |  |
| 7/15 |  | 7560 | 7392 |  |  |
| 8/15 |  | 8640 | 8472 |  |  |
| 9/15 |  | 9720 | 9552 |  |  |
| 10/15 |  | 10800 | 10632 |  |  |
| 11/15 |  | 11880 | 11712 |  |  |

TABLE 29-continued

| LDPC Rate | Nldpc | Kldpc | Kbch | BCH error correction capability | Nbch-Kbch |
|---|---|---|---|---|---|
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Equation.

$$B_{ldpc}[I_{ldpc}P_{ldpc}] = [i_0, i_1, \ldots, i_{K_{ldpc}-1}, p_0, p_1, \ldots, p_{N_{ldpc}-K_{ldpc}-1}]$$ [Equation 3]

The parameters for long FECBLOCK and short FECBLOCK are given in the above table 28 and 29, respectively.

The detailed procedure to calculate Nldpc−Kldpc parity bits for long FECBLOCK, is as follows:

1) Initialize the parity bits, $$p_0 = p_1 = p_2 = \ldots = p_{N_{ldpc}-K_{ldpc}-1} = 0$$ [Equation 4]

2) Accumulate the first information bit—i0, at parity bit addresses specified in the first row of an addresses of parity check matrix. The details of addresses of parity check matrix will be described later. For example, for rate 13/15:

$$p_{983} = p_{983} \oplus i_0 \quad p_{983} = p_{983} \oplus i_0$$

$$p_{4837} = p_{4837} \oplus i_0 \quad p_{4989} = p_{4989} \oplus i_0$$

$$p_{6138} = p_{6138} \oplus i_0 \quad p_{6458} = p_{6458} \oplus i_0$$

$$p_{6921} = p_{6921} \oplus i_0 \quad p_{6974} = p_{6974} \oplus i_0$$

$$p_{7572} = p_{7572} \oplus i_0 \quad p_{8260} = p_{8260} \oplus i_0$$

$$p_{8496} = p_{8496} \oplus i_0$$ [Equation 5]

3) For the next 359 information bits, is, s=1, 2, ..., 359 accumulate is at parity bit addresses using following Equation.

$$\{x + (s \bmod 360) \times Q_{ldpc}\} \bmod (N_{ldpc} - K_{ldpc})$$ [Equation 6]

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007} = p_{1007} \oplus i_1 \quad p_{2839} = p_{2839} \oplus i_1$$

$$p_{4861} = p_{4861} \oplus i_1 \quad p_{5013} = p_{5013} \oplus i_1$$

$$p_{6162} = p_{6162} \oplus i_1 \quad p_{6482} = p_{6482} \oplus i_1$$

$$p_{6945} = p_{6945} \oplus i_1 \quad p_{6998} = p_{6998} \oplus i_1$$

$$p_{7596} = p_{7596} \oplus i_1 \quad p_{8284} = p_{8284} \oplus i_1$$

$$p_{8520} = p_{8520} \oplus i_1$$ [Equation 7]

4) For the 361st information bit i360, the addresses of the parity bit accumulators are given in the second row of the addresses of parity check matrix. In a similar manner the addresses of the parity bit accumulators for the following 359 information bits is, s=361, 362, ..., 719 are obtained using the Equation 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{i-1}, \quad i=1,2, \ldots, N_{ldpc} - K_{ldpc} - 1$$ [Equation 8]

where final content of pi, i=0, 1, ... Nldpc−Kldpc−1 is equal to the parity bit pi.

TABLE 30

| Code Rate | Qldpc |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | Qldpc |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
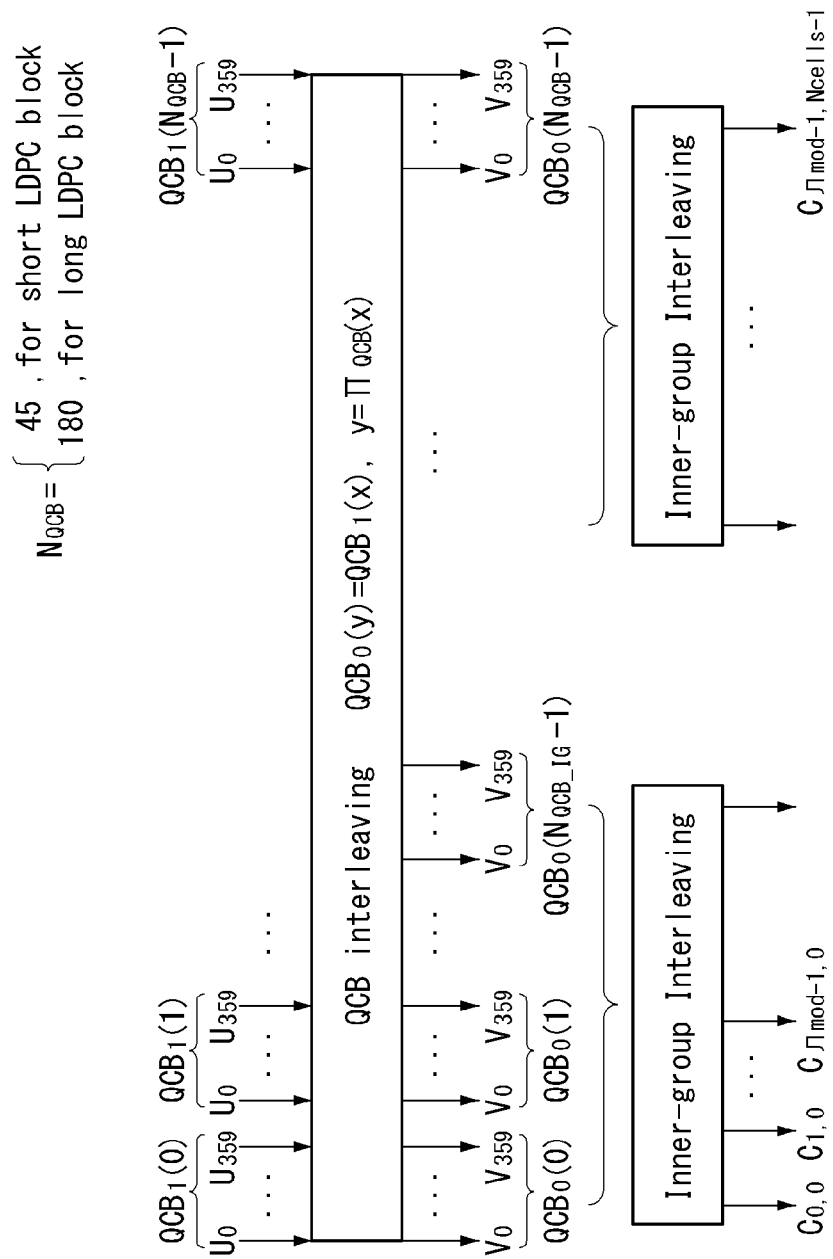
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/ηmod or 16200/ηmod according to the FECBLOCK length. The QCB interleaving pattern is unique to each combination of modulation type and LDPC code rate.

After QCB interleaving, inner-group interleaving is performed according to modulation type and order (ηmod) which is defined in the below table 32. The number of QC blocks for one inner-group, NQCB_IG, is also defined.

TABLE 32

| Modulation type | ηmod | NQCB_IG |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with NQCBIG_QC blocks of the QCB interleaving output. Inner-group interleaving has a process of writing and reading the bits of the inner-group using 360 columns and NQCB_IG rows. In the write operation, the bits from the QCB interleaving output are written row-wise. The read operation is performed column-wise to read out m bits from each row, where m is equal to 1 for NUC and 2 for NUQ.

Figure 24:
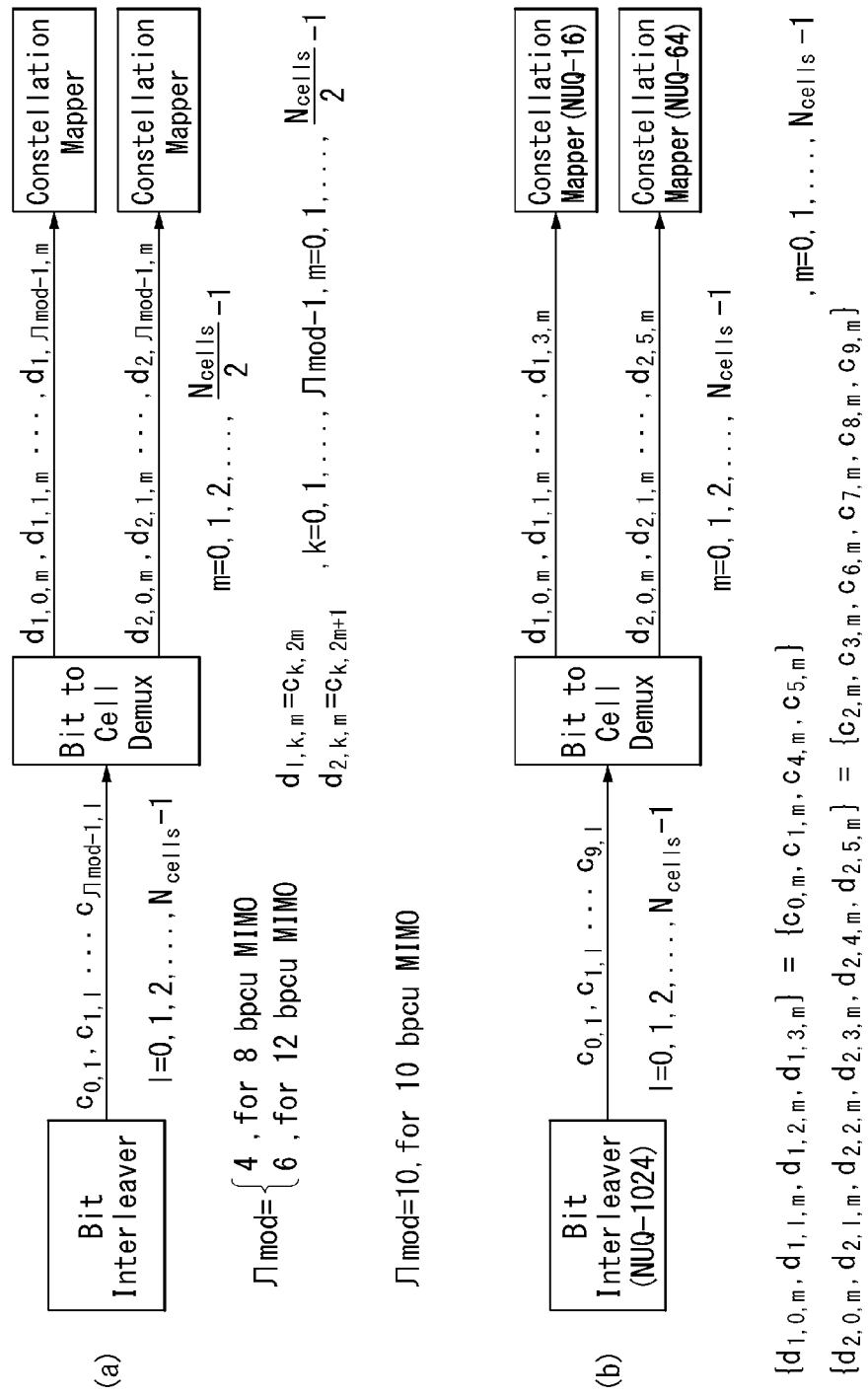
FIG. 24 illustrates a cell-word demultiplexing according to an embodiment of the present invention.

FIG. 24 illustrates a cell-word demultiplexing according to an embodiment of the present invention.

shows a cell-word demultiplexing for 8 and 12 bpcu MIMO and (b) shows a cell-word demultiplexing for 10 bpcu MIMO.

Each cell word (c0,1, c1,1, . . . , cηmod-1,1) of the bit interleaving output is demultiplexed into (d1,0,m, d1,1,m . . . , d1,ηmod-1,m) and (d2,0,m, d2,1,m . . . , d2,ηmod-1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, . . . , c9,1) of the Bit Interleaver output is demultiplexed into (d1,0,m, d1,1,m . . . , d1,3,m) and (d2,0,m, d2,1,m . . . , d2,5,m), as shown in (b).

Figure 25:
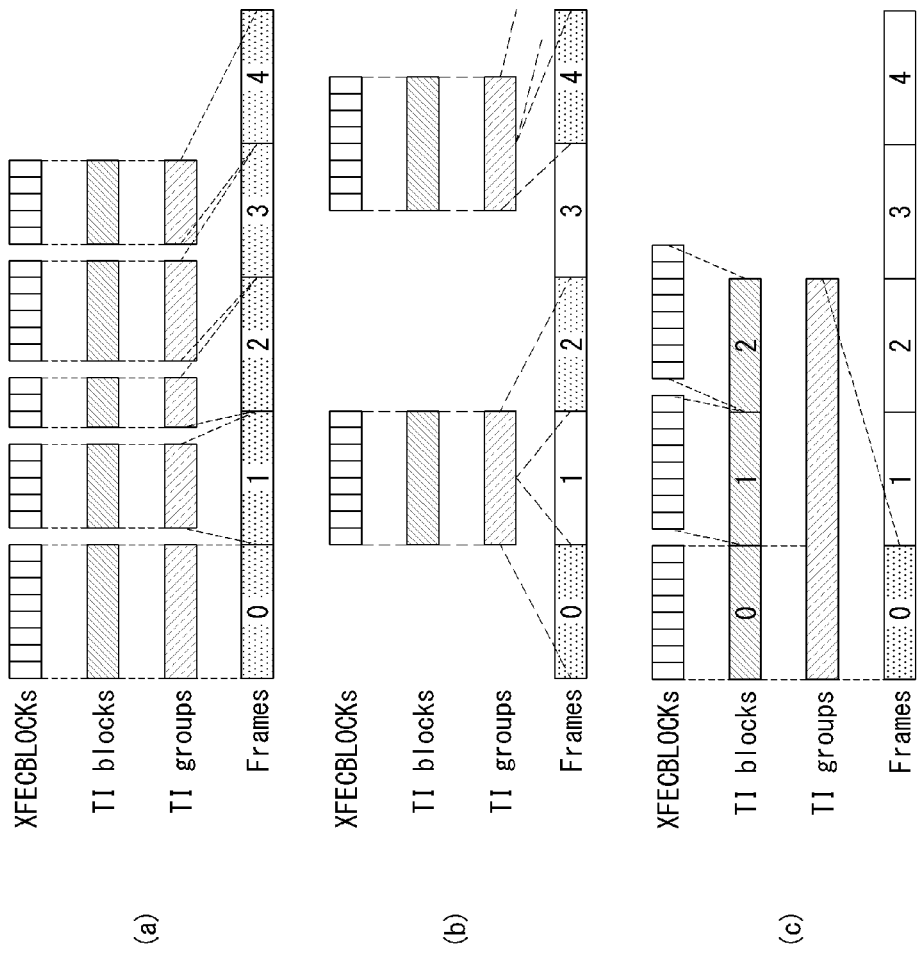
FIG. 25 illustrates a time interleaving according to an embodiment of the present invention.

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group (n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_BLOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Mode | Description |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = NTI, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, K, d_{n,s,0,N_{cells}-1}, d_{n,s,1,0}, K, d_{n,s,1,N_{cells}-1},$$

$$K, d_{n,s,N_{xBLOCK\_TI}(n,s)-1,0}, K, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of } SSDA \text{ encoding} \\ g_{n,s,r,q}, & \text{the output of } MIMO \text{ encoding} \end{cases}.$$

In addition, assume that output XFECBLOCKs from the time interleaver 5050 are defined as $$\left(h_{n,s,0}, h_{n,s,1}, K, h_{n,s,i}, K, h_{n,s,N_{xBLOCK\_TI}(n,s) \times N_{cells}-1}\right),$$

where $h_{n,s,i}$ is the ith output cell (for $i=0, K, N_{xBLOCK\_TI}(n,s) \times N_{cells}-1$) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

Figure 26:
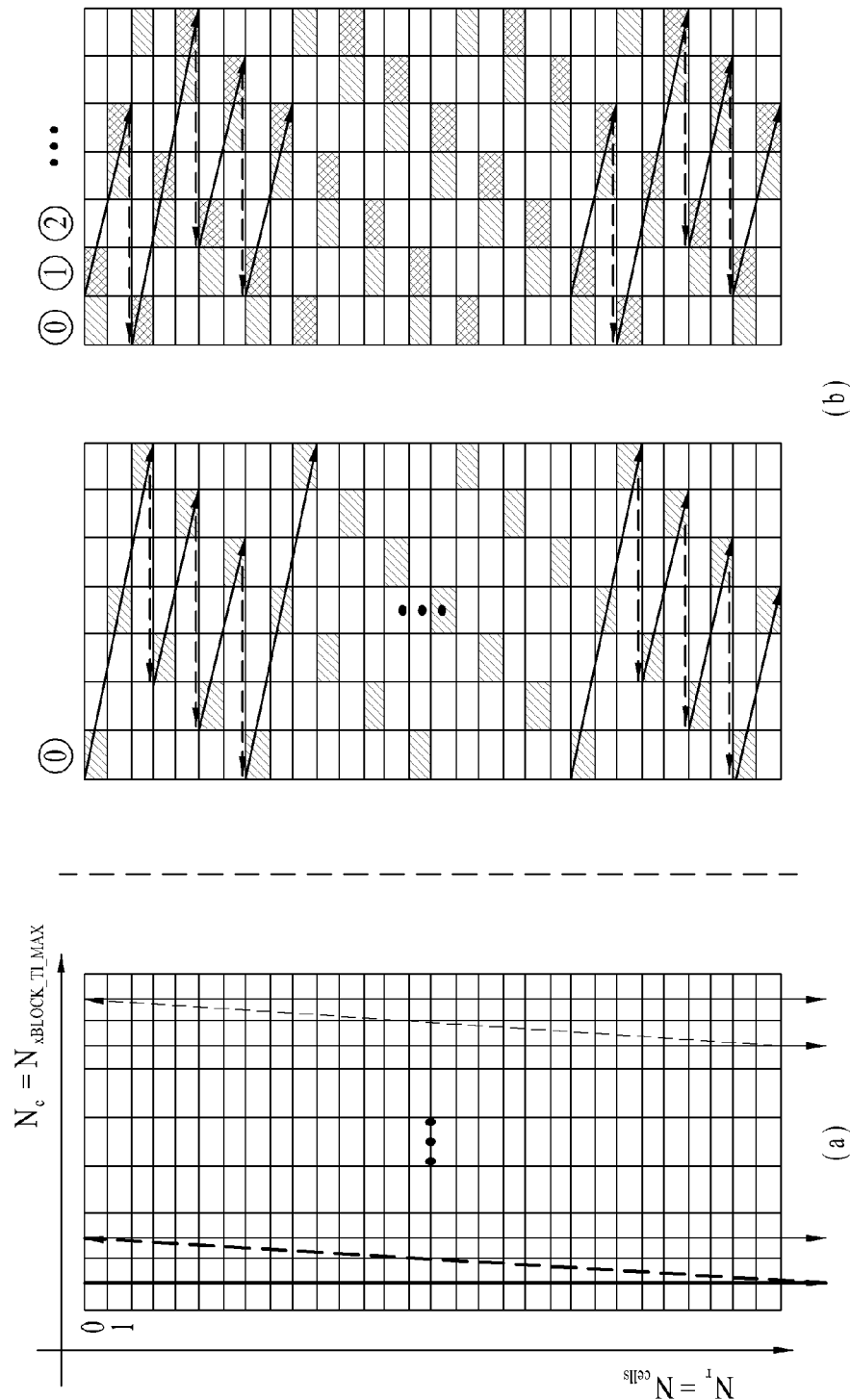
FIG. 26 illustrates a basic operation of a twisted row-column block interleaver according to an exemplary embodiment of the present invention.

FIG. 26 illustrates a basic operation of a twisted row-column block interleaver according to an exemplary embodiment of the present invention.

FIG. 26A illustrates a writing operation in a time interleaver and FIG. 26B illustrates a reading operation in the time interleaver. As illustrated in FIG. 26A, a first XFECBLOCK is written in a first column of a time interleaving memory in a column direction and a second XFECBLOCK is written in a next column, and such an operation is continued. In addition, in an interleaving array, a cell is read in a diagonal direction. As illustrated in FIG. 26B, while the diagonal reading is in progress from a first row (to a right side along the row starting from a leftmost column) to a last row, $N_r$ cells are read. In detail, when it is assumed that $z_{n,s,i}$ ($i=0, \ldots, N_r, N_c$) is a time interleaving memory cell position to be sequentially read, the reading operation in the interleaving array is executed by calculating a row index $R_{n,s,i}$, a column index $C_{n,s,i}$, and associated twist parameter $T_{n,s,i}$ as shown in an equation given below.

GENERATE($R_{n,s,i}, C_{n,s,i}$) =    [Equation 9]
{
  $R_{n,s,i} = \text{mod}(i, N_r)$
  $T_{n,s,i} = \text{mod}(S_{shift} \times R_{n,s,i}, N_c)$,
  $C_{n,s,i} = \text{mod}\left(T_{n,s,i} + \left\lfloor \frac{i}{N_r} \right\rfloor, N_c\right)$
}

Where, $S_{shift}$ is a common shift value for a diagonal reading process regardless of $N_{xBLOCK\_TI}(n,s)$ and the shift value is decided by $N_{xBLOCK\_TI\_MAX}$ given in PLS2-STAT as shown in an equation given below.

$$\text{for} \begin{cases} N'_{xBLOCK\_TI\_MAX} = & \text{if } N_{xBLOCK\_TI\_MAX} \text{mod} 2 = 0 \\ N_{xBLOCK\_TI\_MAX} + 1, & \\ N'_{xBLOCK\_TI\_MAX} = & \text{if } N_{xBLOCK\_TI\_MAX} \text{mod} 2 = 1 \\ N_{xBLOCK\_TI\_MAX}, & \end{cases} \quad [\text{Equation 10}]$$

$$S_{shift} = \frac{N'_{xBLOCK\_TI\_MAX} - 1}{2}$$

Consequently, the cell position to be read is calculated by a coordinate $z_{n,s,i} = N_r C_{n,s,i} + R_{n,s,i}$.

Figure 27:
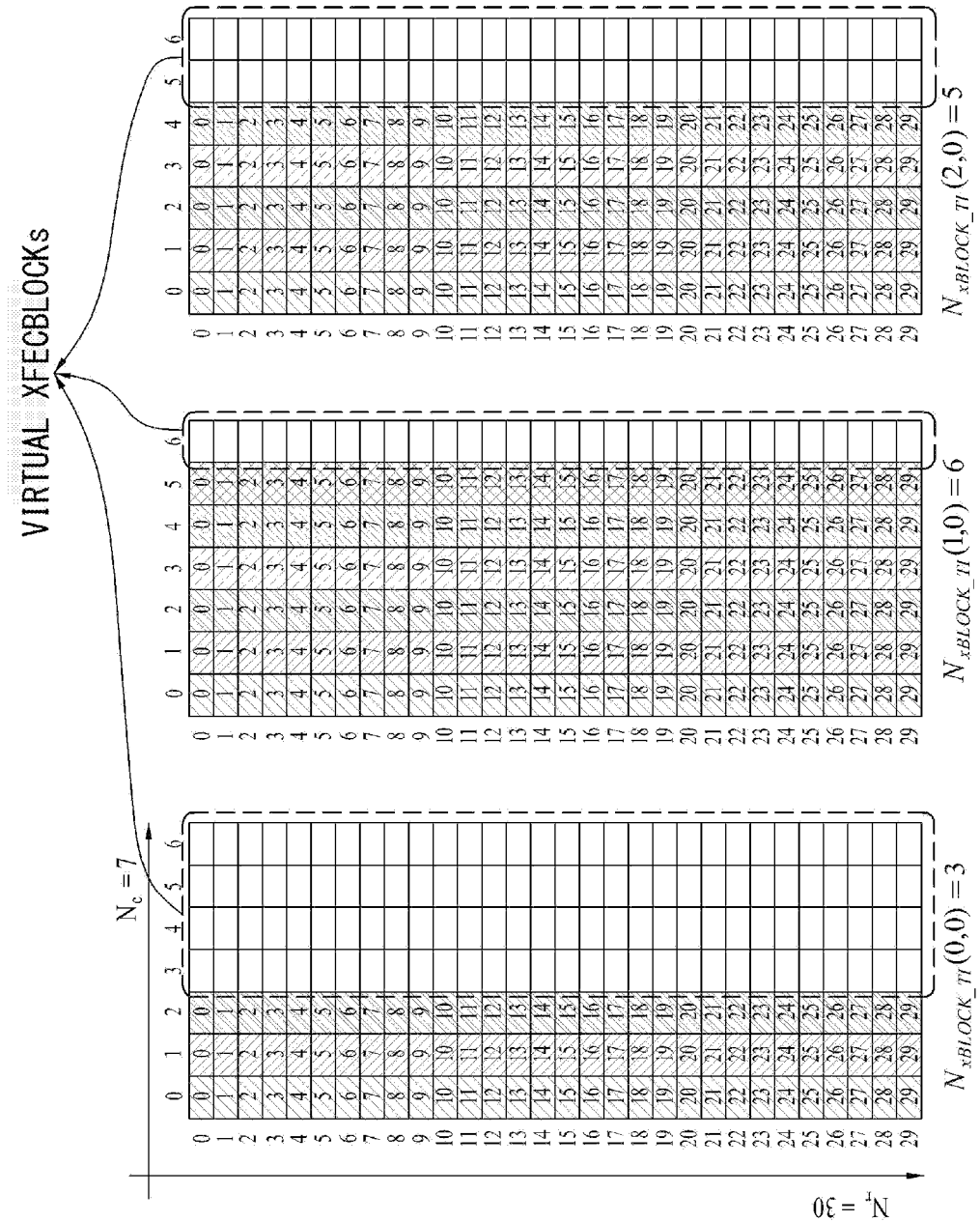
FIG. 27 illustrates an operation of a twisted row-column block interleaver according to another exemplary embodiment of the present invention.

FIG. 27 illustrates an operation of a twisted row-column block interleaver according to another exemplary embodiment of the present invention.

In more detail, FIG. 27 illustrates an interleaving array in the time interleaving memory for respective time interleaving groups including a virtual XFECBLOCK when $N_{xBLOCK\_TI}(0,0)=3$, $N_{xBLOCK\_TI}(1,0)=6$, and $N_{xBLOCK\_TI}(2,0)=5$.

A variable $N_{xBLOCK\_TI}(n,s) = N_r$ will be equal to or smaller than $N'_{xBLOCK\_TI\_MAX}$. Accordingly, in order for a receiver to achieve single memory interleaving regardless of $N_{xBLOCK\_TI}(n,s)$, the size of the interleaving array for the twisted row-column block interleaver is set to a size of $N_r \times N_c = N_{cells} \times N'_{xBLOCK\_TI\_MAX}$ by inserting the virtual XFECBLOCK into the time interleaving memory and a reading process is achieved as shown in an equation given below.

$p=0$;

for $i=0; i< N_{cells} N'_{xBLOCK\_TI\_MAX}; i=i+1$

{GENERATE($R_{n,s,i}, C_{n,s,i}$);

$V_i = N_r C_{n,s,j} + R_{n,s,j}$ if $V_i < N_{cells} N_{xBLOCK\_TI}(n,s)$

{

$Z_{n,s,p} = V_i; p=p+1$

}

}    [Equation 11]

The number of the time interleaving groups is set to 3. An option of the time interleaver is signaled in the PLS2-STAT by DP_TI_TYPE='0', DP_FRAME_INTERVAL='1', and DP_TI_LENGTH='1', that is, NTI=1, IJUMP=1, and PI=1. The number of respective XFECBLOCKs per time interleaving group, of which Ncells=30 is signaled in PLS2-DYN data by NxBLOCK_TI(0,0)=3, NxBLOCK_TI(1,0)=6, and NxBLOCK_TI(2,0)=5 of the respective XFECBLOCKs. The maximum number of XFECBLOCKs is signaled in the PLS2-STAT data by NxBLOCK_Group_MAX and this is continued to $\lfloor N_{xBLOCK\_Group\_MAX}/N_{TI} \rfloor = N_{xBLOCK\_TI\_MAX} = 6$.

Figure 28:
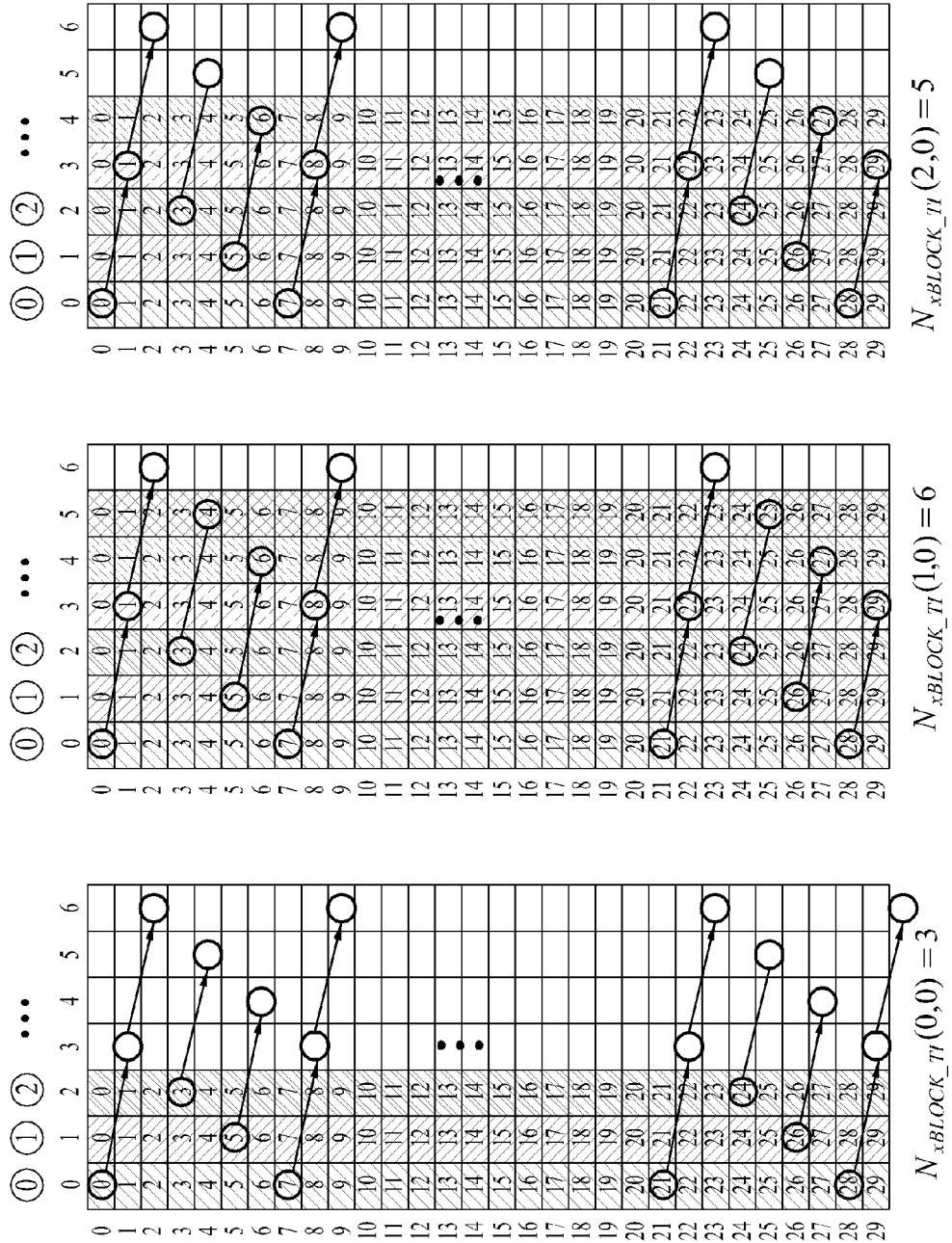
FIG. 28 illustrates a diagonal reading pattern of the twisted row-column block interleaver according to the exemplary embodiment of the present invention.

FIG. 28 illustrates a diagonal reading pattern of the twisted row-column block interleaver according to the exemplary embodiment of the present invention.

In more detail, FIG. 28 illustrates a diagonal reading pattern from respective interleaving arrays having parameters $N'_{xBLOCK\_TI\_MAX}=7$ and Sshift=(7−1)/2=3. In this case, during a reading process expressed by a pseudo code given above, when $V_i \geq N_{cells} N_{xBLOCK\_TI}(n,s)$ a value of Vi is omitted and a next calculation value of Vi is used.

Figure 29:
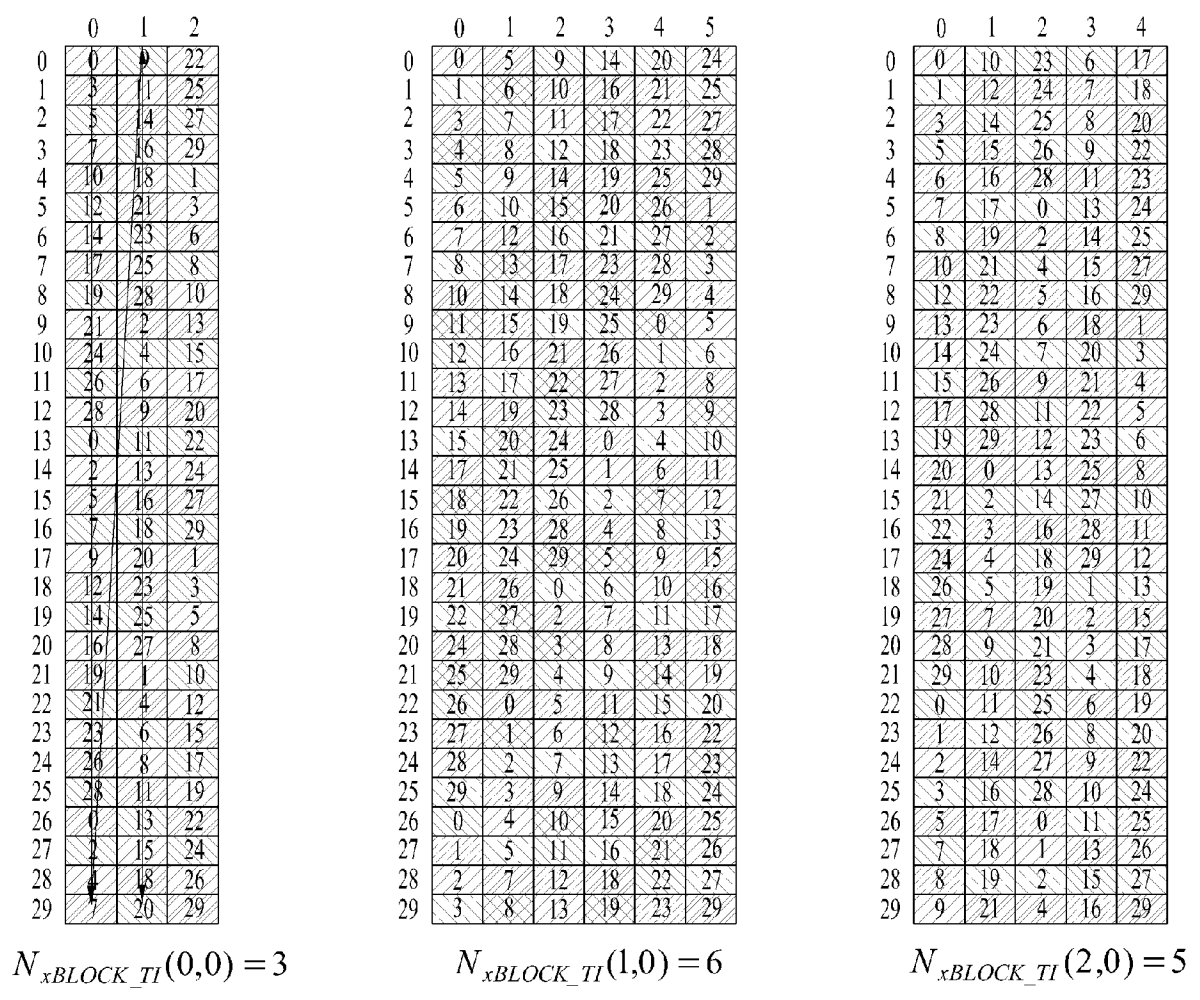

FIG. 29 illustrates XFECBLOCK interleaved from each interleaving array according to an exemplary embodiment of the present invention.

FIG. 29 illustrates XFECBLOCK interleaved from each interleaving array having parameters $N'_{xBLOCK\_TI\_MAX}=7$ and Sshift=3 according to an exemplary embodiment of the present invention.

In this document, the DP refers to the Physical Layer Pipe (PLP), and PLS information can be called Layer 1 (L1) information or L1 signaling information. PLS1 information may be called L1 static information, L1 configurable or L1 basic information, and PLS2 information may be called L1 dynamic information or L1 detail information.

Figure 30:
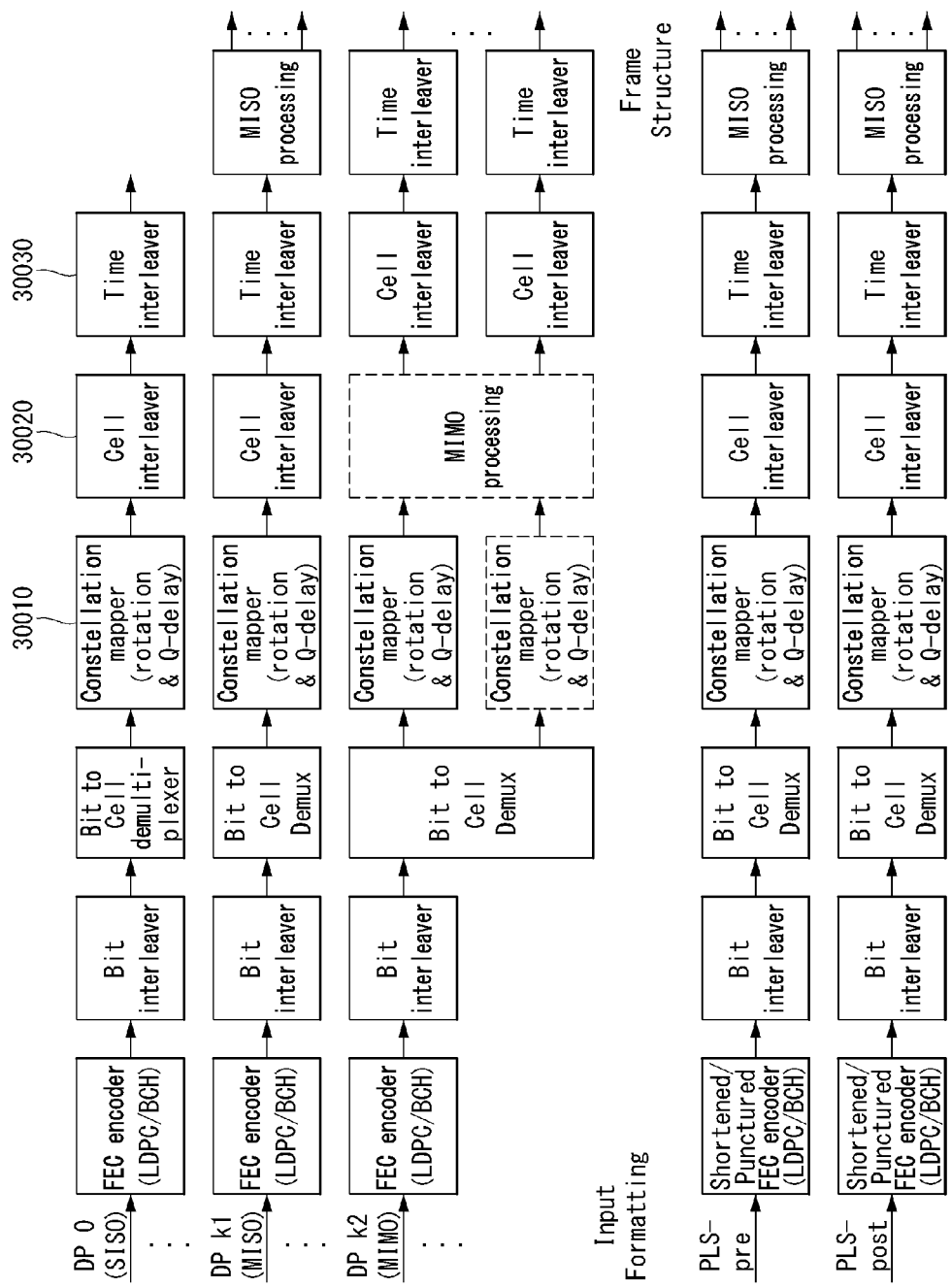
FIG. 30 illustrates a detailed block diagram of a BICM block according to another embodiment of the present invention.

FIG. 30 illustrates a detailed block diagram of a BICM block according to another embodiment of the present invention.

About the specific blocks of FIG. 30, those descriptions which are the same as given above will not repeated.

The constellation mapper 30010 can allocate/map an input bit word to one constellation. At this time, a rotation and Q delay can be applied. In other words, the constellation mapper 30010 can rotate input constellation according to a rotation angle, divide the rotated constellation into in-phase components and quadrature phase components, and delay only the quadrature phase components by an arbitrary amount. Then the constellation mapper 30010 can perform remapping on newly-paired in-phase and quadrature-phase components to form a new constellation.

The cell interleaver 30020 mixes the cells corresponding to one FEC block in a random fashion and outputs the mixed cells in a different order for each FEC block.

The time interleaver 30030 can mix and output cells belonging to a plurality of FEC blocks. Therefore, as the cells of each FEC block are transmitted being distributed within the interval as large as a time interleaving depth, an additional diversity gain can be obtained.

Figure 31:
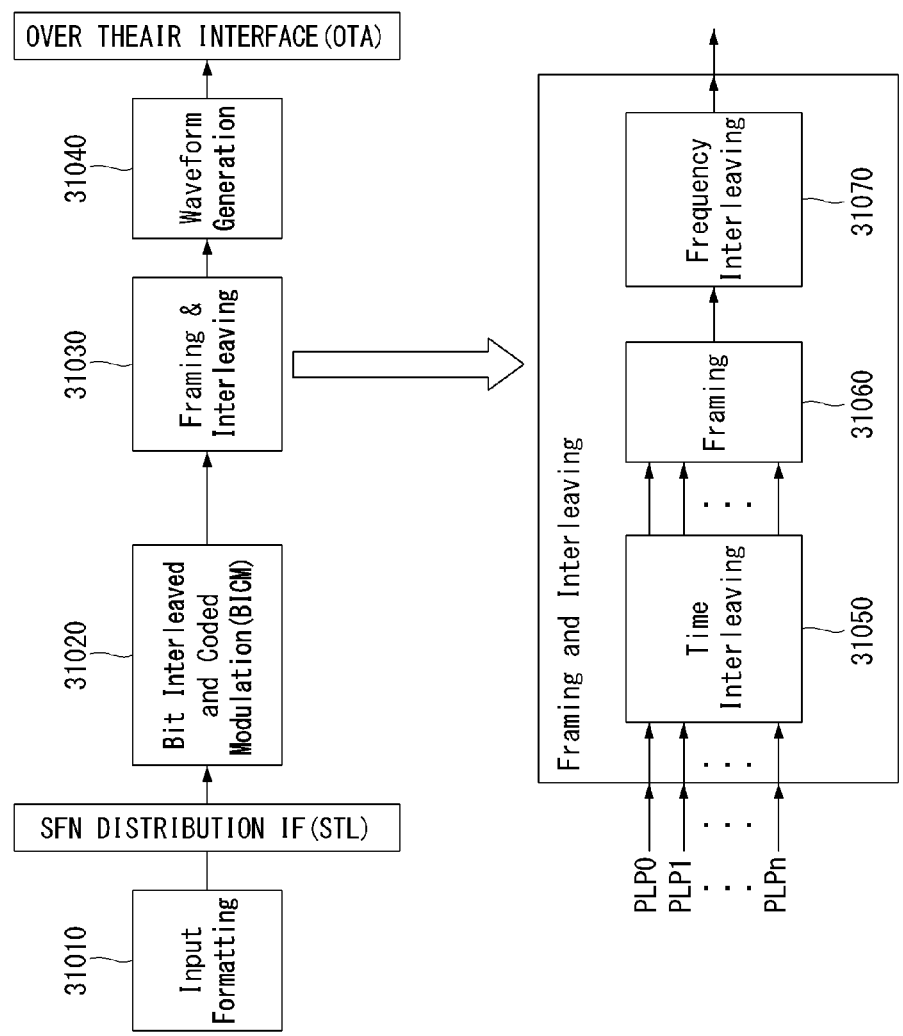
FIG. 31 illustrates the structure of a broadcast signal transmitter according to another embodiment of the present invention.

FIG. 31 illustrates the structure of a broadcast signal transmitter according to another embodiment of the present invention.

The broadcast signal transmitter of FIG. 31 can comprise an input formatting block 31010, a BICM block 31020, and a framing and interleaving block 31030, and a waveform generating block 31040. The framing/interleaving block 31030 of FIG. 31 corresponds to the frame building block of FIG. 1, and the waveform generating block 31040 corresponds to the OFDM generating block of FIG. 1.

Different from the embodiments above, the case of FIG. 31 assumes that the frame building block 31020 includes the time interleaving block 31050, and accordingly, the frame building block 31020 can be referred to as the framing/interleaving block 31050. In other words, the framing/interleaving block 31030 can further comprise a time interleaving block 31050, a framing block 31060, and a frequency interleaving block 31070. The framing/interleaving block 31030 can perform time interleaving on data by using the sub-blocks, generate a signal frame by mapping the data, and perform frequency interleaving.

Except for the fact that the time interleaving block 31050 moves from the BICM block 31020 to the framing/interleaving block 31030, descriptions are the same as given above. The waveform generating block 31040 is the same as the OFDM block of FIG. 1, differing only by the name.

The receiver too may include the time deinterleaving block out of the demapping and decoding block 9020 of FIG. 9 in the frame parsing block 9010 and refer to the frame parsing block 9010 as a frame parsing/deinterleaving block.

FIG. 31 renames the blocks of FIG. 9 by taking into account the inclusion relationship only, of which specific operations are the same as described above. In this document, the terms of block, module, and unit can be used interchangeably to denote the same element in the structures of the transmitter and the receiver system. In what follows, the time interleaving block (time interleaver) according to an embodiment of the present invention and its operation will be described. The time interleaver in this document can be denoted by the time interleaving block 31050 as shown in FIG. 31. In this case, the time interleaver can further comprise a cell grouping block, cell degrouping block, convolutional interleaver, and block interleaver. However, depending on cases, only the portion including the convolutional interleaver and the block interleaver which perform interleaving within the time interleaver may be called the time interleaver. The description above can be applied in the same way to the deinterleaver of the receiver.

Figure 32:
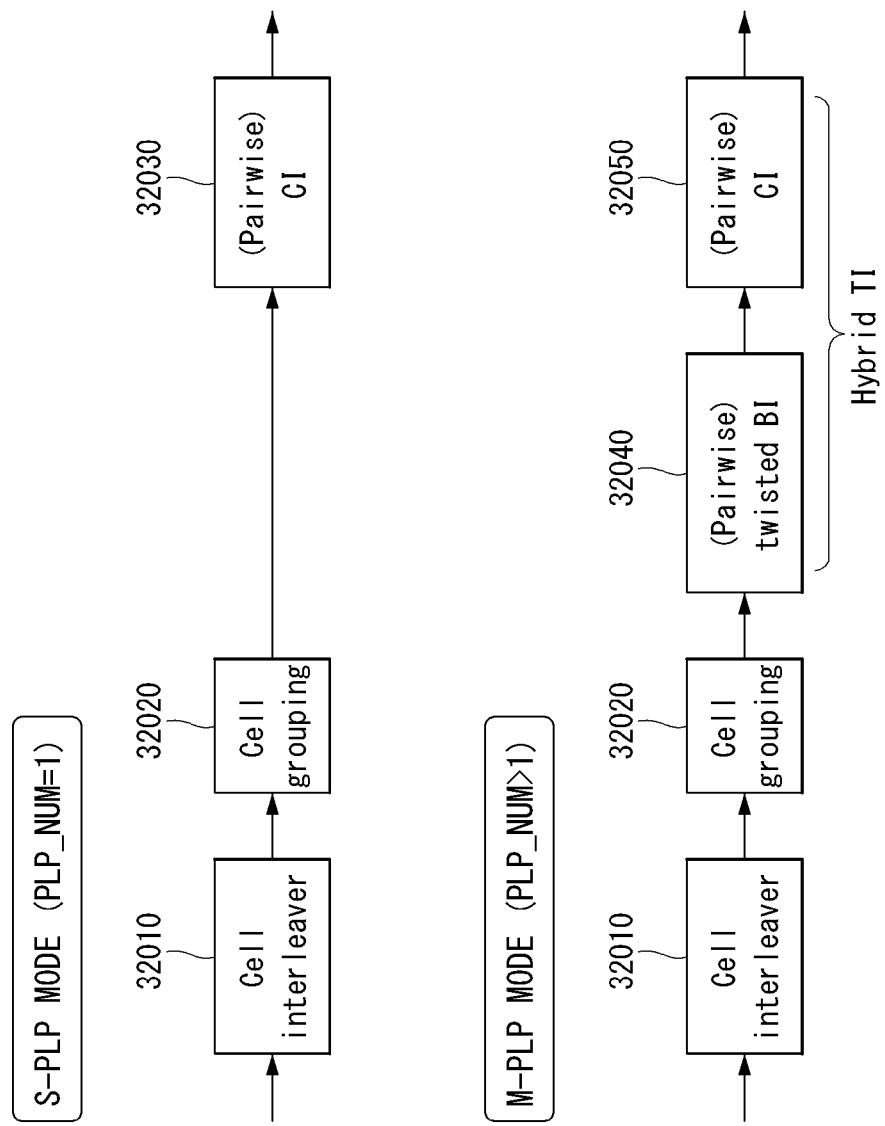
FIG. 32 illustrates a time interleaver according to an embodiment of the present invention.

FIG. 32 illustrates a time interleaver according to an embodiment of the present invention.

As described above, a broadcasting system can process a Single PLP (S-PLP) or Multiple PLP (M-PLP) data.

The broadcast signal transmitter performs time interleaving by using the twisted Block Interleaver (BI) 32050 and the Convolutional Interleaver (CI) 32050 in the case of multiple PLP (M-PLP) mode. In the case of S-PLP mode, the block interleaver 32040 is turned off, and the broadcast signal transmitter can perform time interleaving by using the convolutional interleaver 32030. The time interleaving blocks used in the M-PLP mode may be collectively called a hybrid (time) interleaver or time interleaver. However, the convolutional interleaver 32030 of M-PLP mode uses the convolutional delay-line, while a convolutional interleaver of arbitrary type can be used as the conveolutional interleaver 32050 of S-PLP mode. The convolutional interleaver of S-PLP mode may be called a Sheer CI. However, an interleaver which uses the convolutional delay-line can also be called a Convolutional Interleaver (CI) or a convolutional delay-line (unit/module). The cell interleaver 32010 can be used both for S-PLP and M-PLP mode, or can be used only for the M-PLP mode.

As shown in FIG. 32, the time interleaving block includes the cell grouping block 32020. The broadcast signal transmitter can utilize the memory more efficiently by using the cell grouping block 32020 and increase the interleaving depth. Cell grouping can be carried out in a single-wise or a pairwise manner. In the single-wise grouping scheme, one data cell is mapped to one Memory Unit (MU), while the pairwise grouping scheme maps two consecutive cells belonging to the same PLP into one memory unit. The cell grouping block performing the aforementioned operation may be called a cell coupling block or a cell-to-MU mapper.

Figure 33:
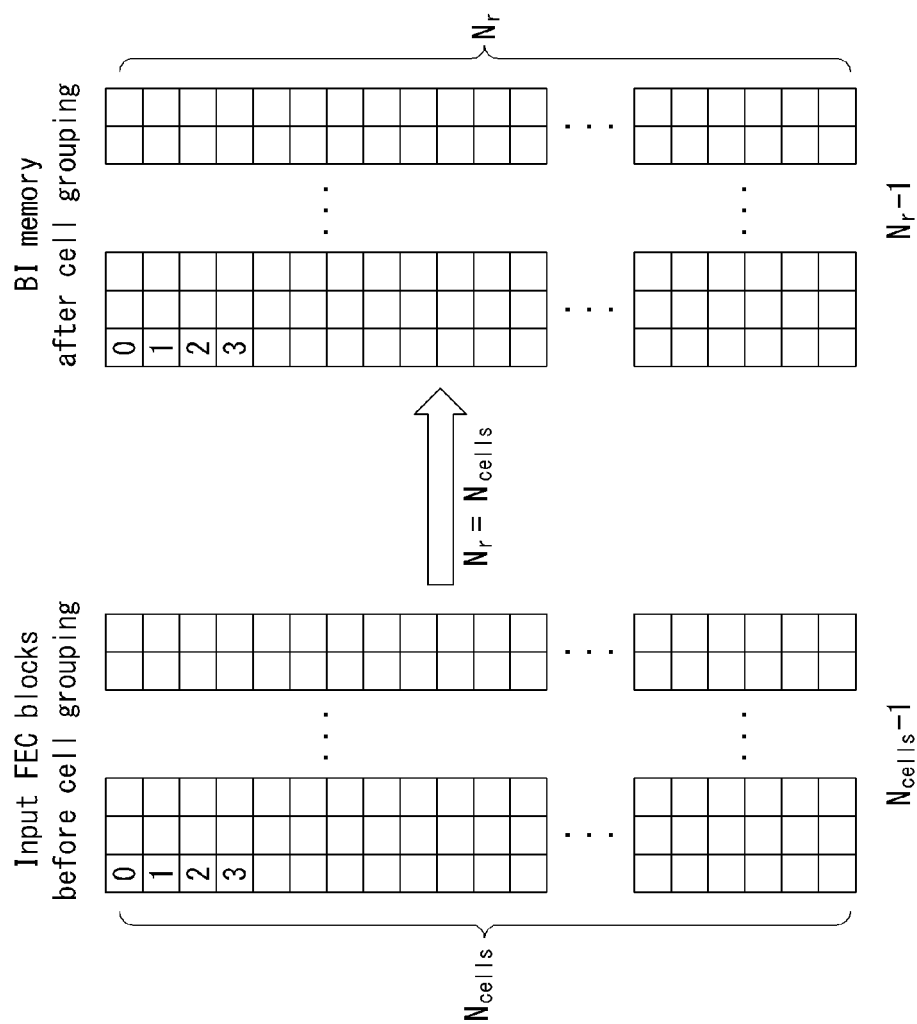
FIG. 33 illustrates the operation of a cell grouping block which performs single-wise grouping according to an embodiment of the present invention.

FIG. 33 illustrates the operation of a cell grouping block which performs single-wise grouping according to an embodiment of the present invention.

As shown in FIG. 33, the cell grouping block maps individual cells belonging to the input FEC block to one memory unit. The cell grouping block maps the cells to the memory, where this mapping operation may be called a storing or writing operation.

Since one cell is mapped to one memory unit, the number of cells (N_cells) in the row direction of the input FEC block becomes the same as the number of memory units (N_r) in the row direction of the bit interleaver memory (N_r=N_cells). Therefore, the operation of FIG. 33 may be called one-to-one cell-to-memory mapping.

Figure 34:
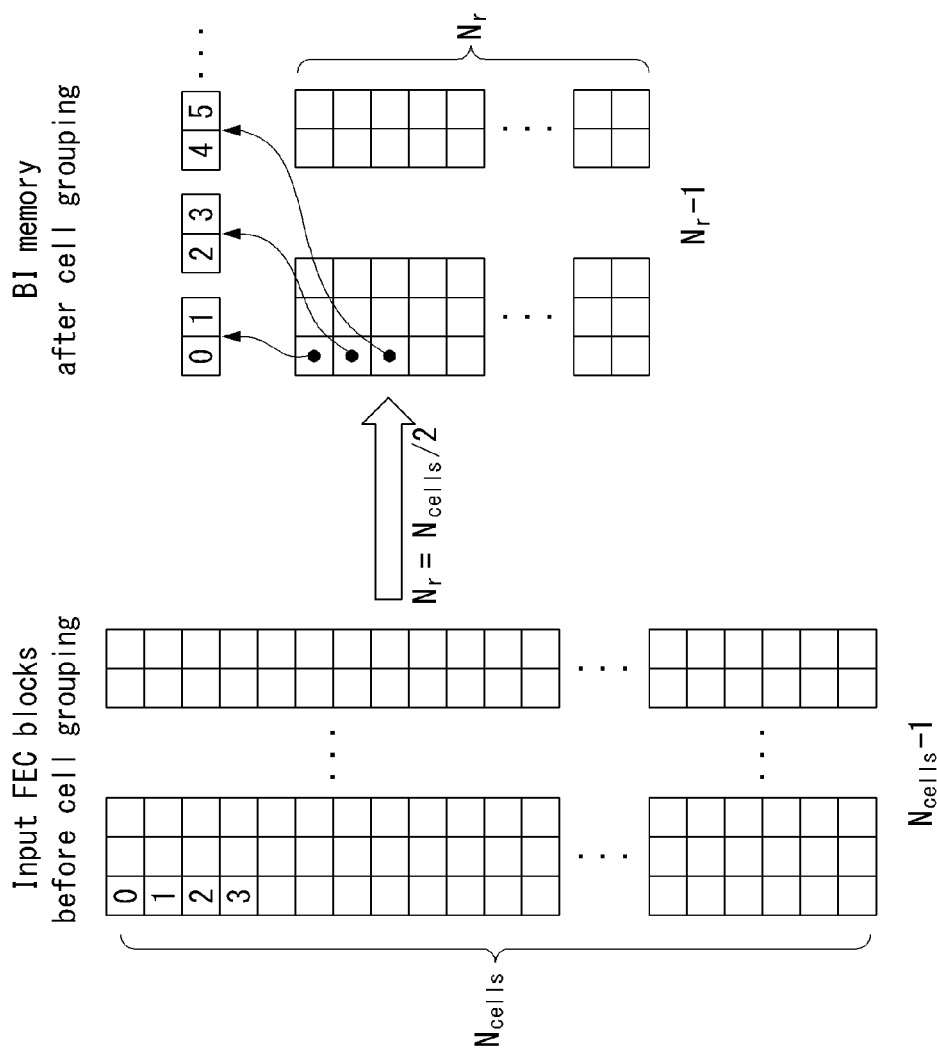
FIG. 34 illustrates the operation of a cell grouping block which performs pair-wise grouping according to an embodiment of the present invention.

FIG. 34 illustrates the operation of a cell grouping block which performs pair-wise grouping according to an embodiment of the present invention.

In FIG. 34, the cell grouping block maps two consecutive cells among the cells belonging to the input FEC block into one memory unit. Since two cells are mapped to one memory unit, the number of memory units in the row direction of the bit interleaver memory (N_r) equals half the number of cells (N_cells) in the row direction of the input FEC block (N_r=Ncells/2).

Since the size of the TI memory is limited, the pairwise grouping can be limited to a modulation scheme which requires relatively low bit resolution, such as QPSK or 16 QAM. Since interleaving is carried out by putting two cells into one memory unit of the time interleaver, the pairwise grouping brings an effect of doubling the performance of interleaving depth. However, at the same time, zapping-time or deinterleaving latency can be increased at the receiver.

It is only when the information of whether the cell grouping block performs single-wise grouping or pairwise grouping is signaled that the receiver can perform an inverse process according to the signaling. In this document, the signaling information can be called pairwise time interleaving information.

In the embodiment of the present invention, the pairwise TI information may be signaled in the form of a pairwise TI flag (PAIRWISE_TI_FLAG) having the bit value of 0 or 1. If the pairwise TI information, namely, the value of the pairwise TI flag (PAIRWISE_TI_FLAG) is 0, it indicates that single-wise grouping has been performed while pairwise grouping has not been performed. On the other hand, the value of 1 may indicate that pairwise grouping has been performed.

If the modulation scheme employs QPSK or 16-QAM according to an embodiment, namely, QAM order, single-wise grouping or pairwise grouping can be used. On the other hand, if 64-QAM, 256-QAM, 1024-QAM, and 4096 QAM is used, only the single-wise grouping can be used.

In case the pairwise cell grouping is performed selectively, the broadcast signal transmitter or the time interleaver can be said to be operating in an extended interleaving mode. In case the time interleaving block operates in the extended interleaving mode, each memory unit comprises two cells. In an embodiment of the present invention, the time interleaving module can use the extended interleaving mode selectively only when PLP data are modulated according to the QPSK scheme. And the pairwise TI information can be called extended interleaving information or TI extended interleaving information. Therefore, the extended interleaving information can be used to indicate whether the extended interleaving mode has been used for the corresponding PLP, in other words, whether pairwise cell grouping is used and one memory unit consists of two cells.

Figure 35:
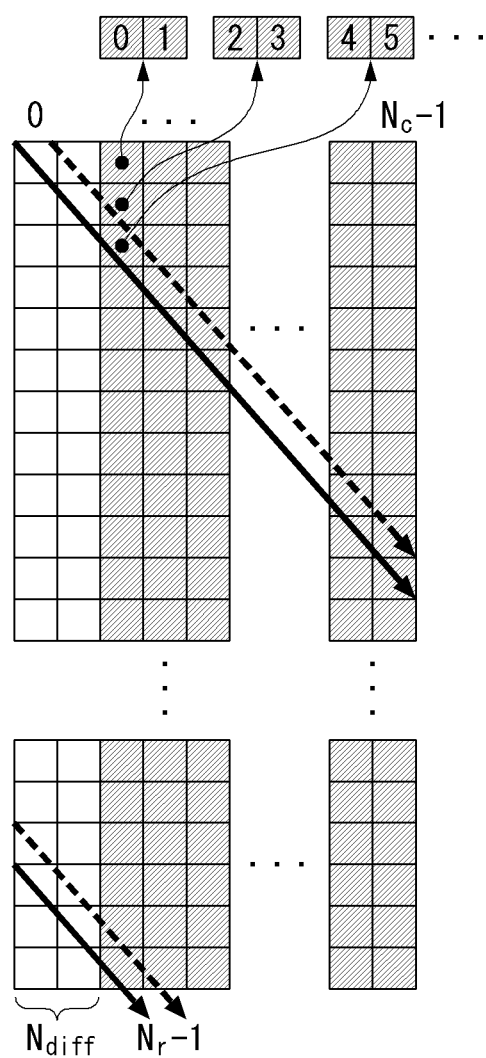
FIG. 35 illustrates the operation of a block interleaver according to an embodiment of the present invention.

FIG. 35 illustrates the operation of a block interleaver according to an embodiment of the present invention.

The operation of the block interleaver of FIG. 35 can be modeled according to Eq. 12 below.

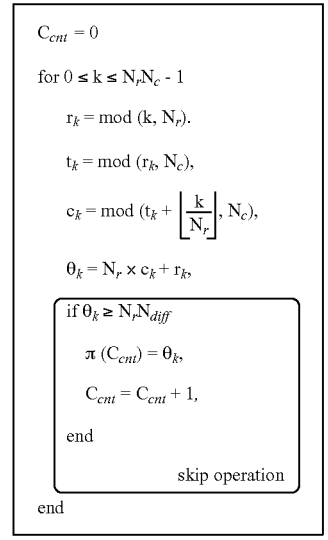

[Equation 12]

$$C_{cnt} = 0$$
$$\text{for } 0 \le k \le N_r N_c - 1$$
$$r_k = \mod(k, N_r),$$
$$t_k = \mod(r_k, N_c),$$
$$c_k = \mod(t_k + \left\lfloor \frac{k}{N_r} \right\rfloor, N_c),$$
$$\theta_k = N_r \times c_k + r_k,$$
$$\text{if } \theta_k \ge N_r N_{diff}$$
$$\pi(C_{cnt}) = \theta_k,$$
$$C_{cnt} = C_{cnt} + 1,$$
$$\text{end}$$
skip operation
end The operation of the block interleaver according to Eq. 12 can be carried out as described in FIG. 26 and Eq. 9. The skip operation part of Eq. 12 performs the role of skipping reading out those cells belonging to a virtual FEC block while the memory is being read out. However, it should be noted that in the case of FIG. 35 and Eq. 12, the interleaving operation is carried out in memory units, each of which comprises two cells through pairwise grouping. Twisted block interleaving is performed in memory units for which group mapping is applied so that the number of time interleaving memory rows (N_r) equals half of the cells (N_cells).

Figure 36:
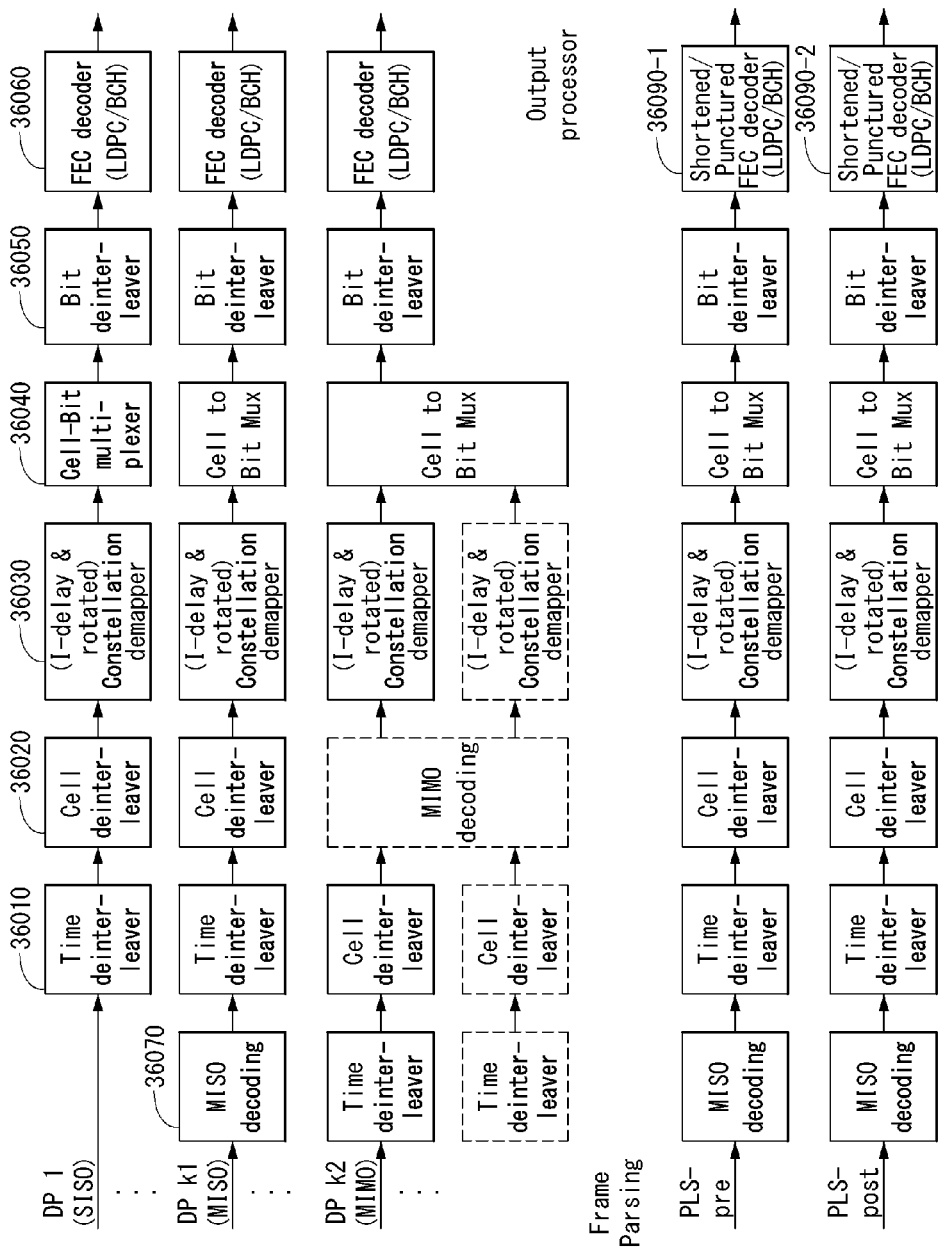
FIG. 36 illustrates a detailed block diagram of a demapping/decoding block according to an embodiment of the present invention.

FIG. 36 illustrates a detailed block diagram of a demapping/decoding block according to an embodiment of the present invention.

The demapping/decoding module of FIG. 36 corresponds to one embodiment of the demapping/decoding module 9020 described in FIG. 9.

As described above, the coding and modulation module of a transmitter according to one embodiment of the present invention can process input PLPs by applying the SISO, MISO, and MIMO scheme to the input PLPs separately according to their respective paths. Therefore, the demapping/decoding module of FIG. 36 can also include blocks intended to process the data output from the frame parser according to the SISO, MISO, and MIMO scheme in response to the transmitter.

As shown in FIG. 36, the demapping and decoding module according to one embodiment of the present invention can comprise a first block for SISO scheme, a second block for MISO scheme, a third block for MIMO scheme, and a fourth block for processing pre/post information.

The block intended to process an input PLP according to the SISO scheme can comprise a time deinterleaver block 36010, a cell deinterleaver block 36020, a constellation demapper block 36030, a cell-bit demultiplexer block 36040, a bit deinterleaver block 36050, and an FEC decoder block 36060.

The time deinterleaver block 36010 can perform the inverse process of the time deinterleaver block. In other words, the time deinterleaver block 36010 can deinterleave an input symbol interleaved in the time domain into its original position.

The cell deinterleaver block 36020 can perform the inverse process of the cell interleaver block. In other words, the cell deinterleaver block 36020 can deinterleave the positions of the cells spread within one FEC block into their original positions.

The constellation demapper block 36030 can perform the inverse process of the constellation mapper block. In other words, the constellation demapper block 36030 can demap the input signal of the symbol domain into the data of the bit domain. Also, the constellation demapper block 36030 may output bit data determined as a hard decision is carried out and output Log-Likelihood Ratio (LLR) of each bit corresponding to a support decision value or a probabilistic value. If the transmitter applies a rotated constellation to obtain an additional diversity gain, the constellation demapper block 32030 can perform two-dimensional LLR demapping according to the application. The constellation demapper block 32030 can perform calculation so that the transmitter can compensate the delay value with respect to the I or Q component when the LLR is calculated.

The cell-to-bit multiplexer block 36040 can perform the inverse process of the bit-to-cell demultiplexer block. In other words, the cell-to-bit multiplexer block 32040 can restore the bit data mapped in the bit-to-cell demultiplexer block to the original bit stream.

The bit deinterleaver block 36050 can perform the inverse process of the bit interleaver block. In other words, the bit deinterleaver block 36050 can deinterleave the bit stream output from the cell-to-bit multiplexer block 36040 according to the original order thereof.

The FEC decoder block 32060 can perform the inverse process of the FEC encoder block. In other words, the FEC decoder block 32060 can correct the error generated in the signal received through a transmission channel by carrying out LDPC decoding and BCH decoding.

In what follows, described will be only the additional blocks not described in the signal processing based on SISO mode.

The MISO decoder block 36070 can perform the inverse process of the MISO processing block. In case the broadcast signal transmitting and receiving system according to one embodiment of the present invention corresponds to the system uses the STBC, the MISO decoder block 36070 can perform Almouti decoding.

The MIMO decoding block 36080 can receive output data of the cell deinterleaver with respect to an input signal of a receiving antenna and perform MIMO decoding as an inverse process of the MIMO processing block. To obtain the best decoding performance, the MIMO decoding bock 36080 can perform maximum likelihood decoding or sphere decoding which reduces degree of complexity. Or the MIMO decoding block 36080 can secure improved decoding performance by carrying out MMSE detection or carrying out iterative decoding in conjunction with the MMSE detection.

The FEC decoder blocks 36090-1, 36090-2 processing signaling information (shortened/punctured FEC decoder) can perform the inverse process of the shortened/punctured FEC encoder block. In other words, the shortened/punctured FEC decoder 36090 can perform FEC decoding after additionally carrying out de-shortening and de-puncturing on the data received being shortened/punctured according to the length of PLS data. In this case, since the same FEC decoder used in the data pipe can be used for PLS, it is not necessary to have separate FEC decoder hardware dedicated to PLS; thus, system design can be simplified, and coding can be performed efficiently.

The blocks described above can be omitted according to the intent of a designer or replaced with different blocks providing a similar or the same function.

However, as described above, just as the transmitter moves the time interleaver block from the BICM block to the frame building block or the interleaving/framing block, the time deinterleaver block can be moved from the demapping/decoding block of FIG. 36 to the frame parsing block. In what follows, the time deinterleaver block will be described.

Figure 37:
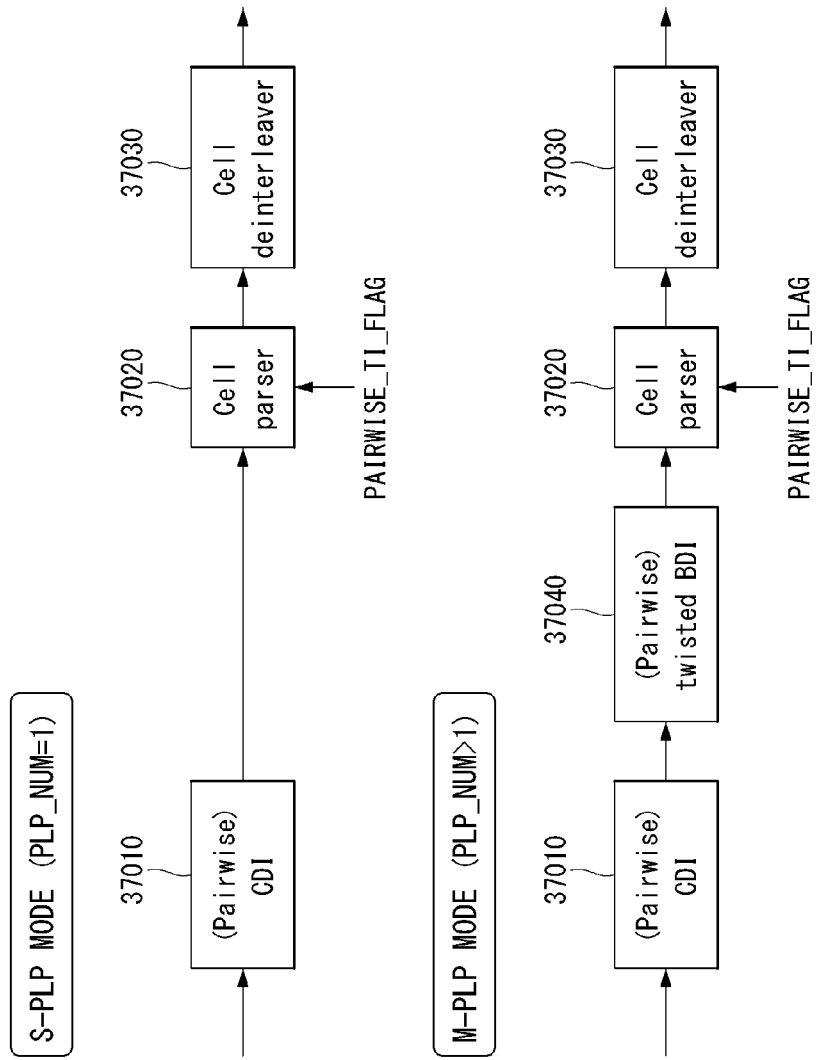
FIG. 37 illustrates a time deinterleaver according to an embodiment of the present invention.

FIG. 37 illustrates a time deinterleaver according to an embodiment of the present invention.

The broadcast signal receiver can process Single PLP (S-PLP) or Multiple PLP (M-PLP). The time interleaving method of the broadcast signal receiver can perform the operation corresponding to the inverse process of time interleaving of the broadcast signal transmitter described above.

The broadcast signal receiver can perform time interleaving by using the Convolutional DeInterleaver (CDI) 37010 and the twisted Block DeInterleaver (BDI) 37040 in the case of M-PLP mode, while, in the case of S-PLP mode, the broadcast signal receiver can turn off the block deinterleaver and perform time deinterleaving by using the CDI 37010. The time interleaving blocks used in the M-PLP mode may be called a hybrid (time) deinterleaver. However, the convolutional deinterleaver 37010 in the M-PLP mode is a deinterleaver which uses a convolutional delay-line, and the convolutional deinterleaver 37010 in the S-PLP mode can be a convolutional CDI of arbitrary type. The cell deinterleaver 37030 may be applied to both of the S-PLP and the M-PLP modes, or only to the M-PLP mode.

In FIG. 37, the time deinterleaving block includes a cell parser block 37020. The broadcast signal transmitter can output the cells grouped into the memory unit again in units of cells by using the cell parser block 37020. By using the pairwise time interleaving information received, the broadcast signal receiver can perform the inverse process of what is carried out when cell grouping is performed in the transmitter. The operation of the broadcast signal receiver performing the inverse process of what is carried out when cell grouping is performed can be called the operation of extended deinterleaving mode. The cell parser block 37020 may be called a cell degrouping block, a cell decoupling block, or an MU-to-cell demapper.

Although not shown in FIG. 37, the receiver too can perform the cell-to-memory unit mapping in the case of extended deinterleaving mode by including cell grouping blocks. In other words, the receiver may perform block deinterleaving and convolutional deinterleaving in units of MUs to each of which two cells are mapped and parse the deinterleaved MUs in units of cells by using the cell parser 37020. In what follows, the above description will be given with more details.

In case pairwise time interleaving information indicates that cell grouping has been carried out at the transmitter, the broadcast signal receiver can perform cell-to-MU grouping as shown in FIG. 33 and perform convolutional deinterleaving and block deinterleaving in units of Mus. A broadcast signal is processed so that deinterleaved MUs can be parsed and output again in units of cells and cell deinterleaving can be applied to the output data.

In what follows, Eq. 13 models the deinterleaving operation of the block deinterleaver.

[Equation 13]

$$C_{cnt} = 0$$
$$\text{for } 0 \leq k \leq N_r N_c - 1$$
$$r_k = \mod(k, N_r).$$
$$t_k = \mod(S_{R,j} \times r_k, N_c),$$
$$c_k = \mod\left(t_k + \left\lfloor \frac{k}{N_r} \right\rfloor, N_c\right),$$
$$\theta_k = N_r \times c_k + r_k,$$
$$\text{if } k \geq N_r N_{diff}$$
$$\pi(C_{cnt}) = \theta_k,$$
$$C_{cnt} = C_{cnt} + 1,$$
$$\text{end}$$
$$\quad\quad\quad\quad\quad \text{skip operation}$$
$$\text{end}$$

The deinterleaving operation expressed by Eq. 13 models the inverse operation of the interleaving operation of Eq. 12. However, virtual cells skipped at the transmitter are recovered before data are input to the memory, and method for recovering skipped virtual cells can vary according to the implementation methods employed. In particular, FIG. 13 can support the single-memory deinterleaving operation.

In case the pairwise cell grouping is carried out selectively, the operating mode of the broadcast signal receiver or the timer interleaver can be called extended deinterleaving mode. In case the time deinterleaving block operates in the extended deinterleaving mode, each memory unit consists of two cells. In the embodiment of the present invention, the time deinterleaving module can use the extended deinterleaving mode selectively only when the PLP data are modulated according to the QPSK scheme. And the pairwise TI information can be called extended interleaving information or TI extended interleaving information. Therefore, the extended interleaving information can be used to indicate whether the extended interleaving mode has been used with respect to the corresponding PLP, namely, pairwise cell grouping is used and one memory unit comprises two cells. In case the extended interleaving information indicates that the transmitter has used cell grouping, the broadcast signal receiver can perform cell grouping at the time of time deinterleaving as well and perform time deinterleaving in units of MUs, each of which consists of two cells.

Figure 38:
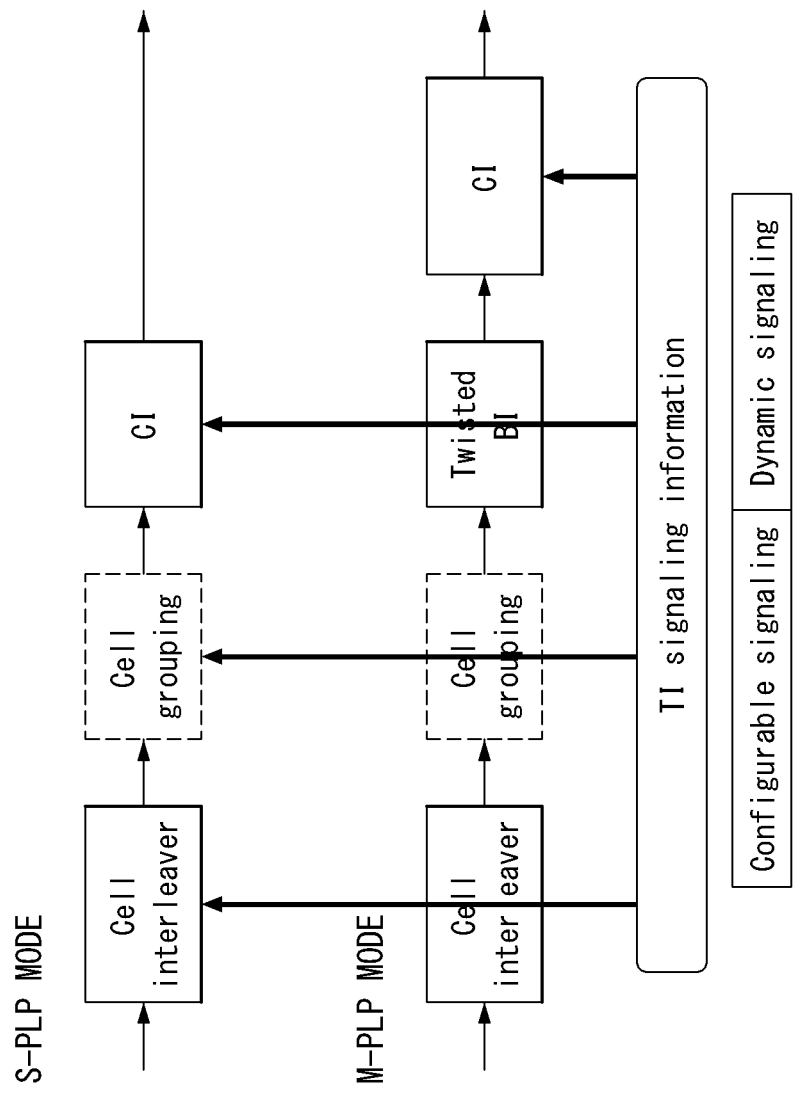
FIG. 38 illustrates a time deinterleaving block of a broadcast signal transmitter.
Figure 39:
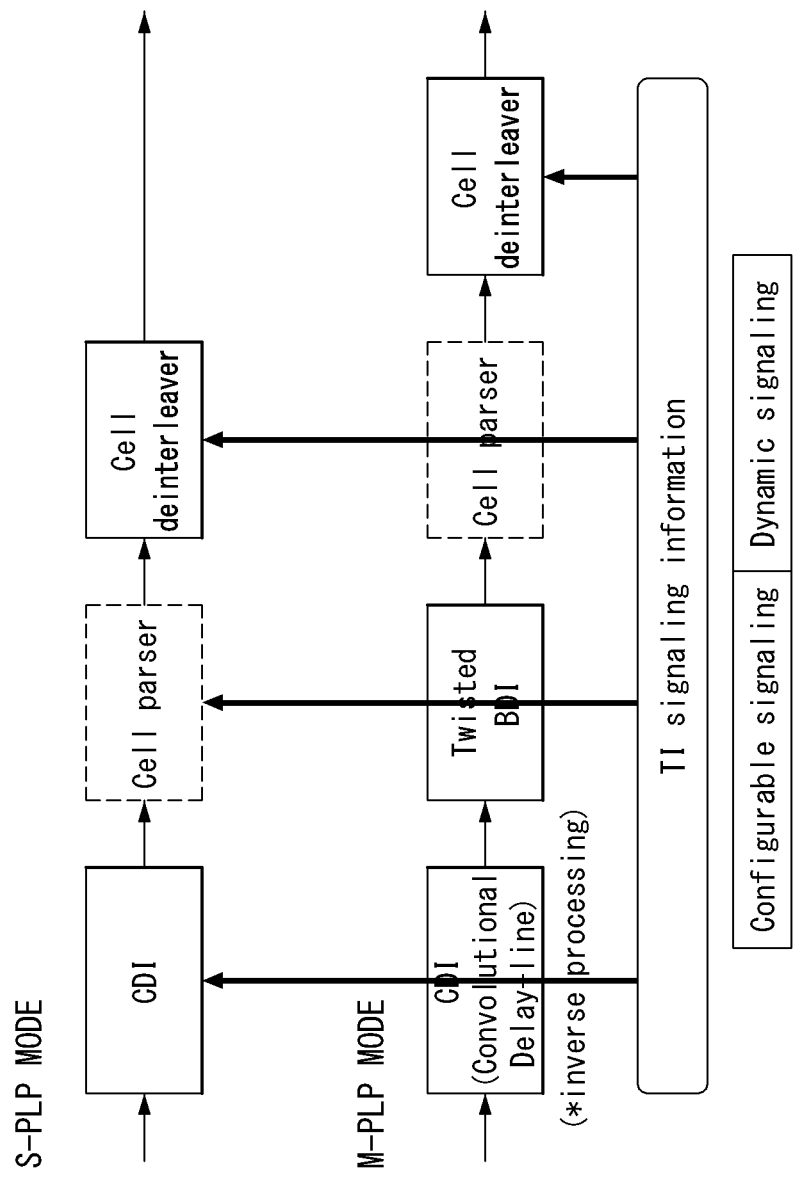
FIG. 39 illustrates a time deinterleaving block of a broadcast signal receiver.

FIG. 38 illustrates a time deinterleaving block of a broadcast signal transmitter, and FIG. 39 illustrates a time deinterleaving block of a broadcast signal receiver.

Descriptions about the time interleaver of FIG. 38 and the time interleaver of FIG. 39 are the same as those given with respect to FIG. 32 and FIG. 37. However, In FIGS. 38 and 39, transmission and reception of signaling information related to the time interleaver are illustrated briefly.

As shown in FIG. 37, the broadcast signal transmitter can transmit signaling information representing time interleaving-related parameters in the form of a preamble. The signaling information about the parameters related to the time interleaving can be called TI signaling information. The TI signaling information can be transmitted by using at least one of the configurable signaling part and the dynamic signaling part among the signaling information included in a transmitted signal. The configurable signaling information corresponds to the part which includes static information within a signal frame, which can be called L1 static information. On the other hand, dynamic signaling information corresponds to the part which includes the information varying for each signal frame, which can be called L1 dynamic information.

The L1 signaling information provides information essential for configurating physical layer parameters. The L1 signaling information can be conveyed to the preamble part of a signal. The L1 signaling information can include L2 static information and L1 dynamic information. The L1 dynamic information can convey detailed parameters which provide sufficient information to decode the PLP required by the receiver. The L1 static information conveys signaling information which defines parameters, most fundamental within one complete frame of a static system and required to decode L1 dynamic information. The length of the L1 static information can be fixed with respect to a frame, but the length of the L1 dynamic information can be varied with respect to a frame.

Figure 40:
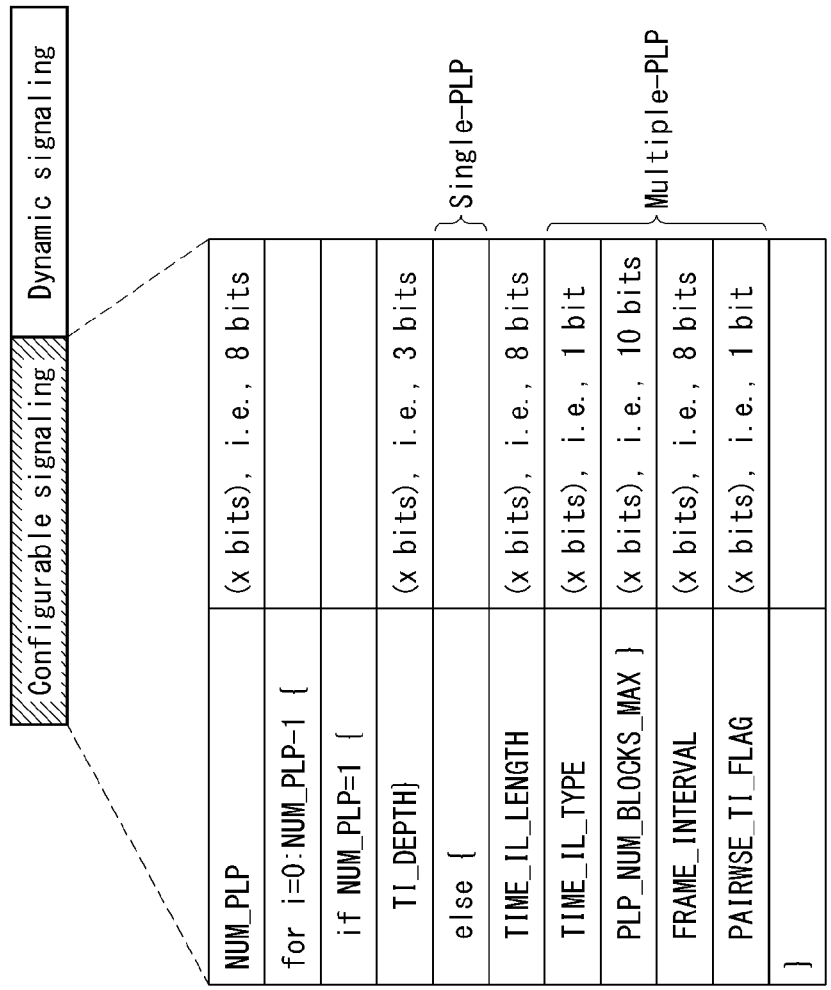
FIG. 40 illustrates TI signaling information according to one embodiment of the present invention.

Also, as shown in FIG. 39, the broadcast signal receiver can control/perform the time interleaving operation by using TI signaling information included in a received signal. The TI signaling information will be described in detail below. Now, in what follows, described will be the TI signaling information included in the configurable signaling information and the dynamic signaling information; however, the position at which the TI signaling information is included is not necessarily limited to the embodiment below. FIGS. 40 and 41 describe TI signaling information according to an embodiment of the present invention; however, the position of the signaling information is included in the L1 information of a preamble and is not necessarily limited to those positions indicated in the embodiments of FIGS. 40 and 41.

FIG. 40 illustrates TI signaling information according to one embodiment of the present invention.

FIG. 40 illustrates signaling information included in the configurable signaling part of a broadcast signal, where the signaling information can be constant within a super frame. At least one of the signaling information illustrated in FIG. 40 can correspond to or be included in the TI signaling information.

The TI signaling information included in the configurable signaling part may be divided into the information in the S-PLP mode and the information in the M-PLP mode depending on the number of PLPs. TI_DEPTH information is the signaling information required to operate the S-PLP mode CI. In this case, additional signaling information may be added to support the operation of flexible CI. TIME_IL_LENGTH information, TIME_IL_TYPE information, and PLP_NUM_BLOCKS_MAX information are the signaling information required to operate TI of M-PLP mode. FRAME_INTERVAL information and PAIRWISE_TI_FLAG information can be applied to both of the S-PLP and M-PLP modes. Each field (signaling information) will be described below.

TI_DEPTH: this x-bit field indicates the used time interleaving depth with dedicated row size. The TI depth field indicates a row size and TI depth according to the row size according to the value allocated as shown in Table 34.

TABLE 34

| Value | Row Size | TI depth |
|---|---|---|
| 000 | 0 | 0 ms |
| 001 | 512 | 50 ms |
| 010 | 724 | 100 ms |
| 011 | 887 | 150 ms |
| 100 | 1024 | 200 ms |
| 101~111 | Reserved | Reserved |

PLP_NUM_BLOCKS_MAX: this x-bit field indicates the maximum value of the number of FEC blocks.

TIME_IL_LENGTH: the use of this x-bit field is determined by the values set within the TIME_IL_TYPE-field as follows. If the TIME_IL_TYPE is set to the value '1', this field indicates P_I, the number of logical frames which carry cells from one TI-block, and there will be one TI-block per Interleaving Frame (N_TI=1). If the TIME_IL_TYPE is set to the value '0', this field indicates N_TI, the number of TI-blocks per Interleaving Frame, and there will be one Interleaving Frame per logical frame (P_I=1). If there is one TI-block per Interleaving Frame and one logical frame per Interleaving Frame, TIME_IL_LENGTH can be set to the value '1' and TIME_IL_TYPE can be set to '0'. If time interleaving is not used for the associated PLP, the TIME_IL_LENGTH-field can be set to the value '0' and TIME_IL_TYPE can be set to '0'.

TIME_IL_TYPE: this 1-bit field indicates the type of time-interleaving. A value of '0' indicates that one or multiple TI-blocks are present per Interleaving Frame but without inter-frame interleaving, while '1' indicates that only one TI-block is present per Interleaving Frame, and the TI-block may be spread over multiple logical frames (inter-frame interleaving).

FRAME_INTERVAL: this x-bit field indicates the ATSC-frame interval (IJUMP) within the super-frame for the associated PLP. For PLPs which do not appear in every frame of the super-frame, the value of this field can equal the interval between successive frames. For example, if a PLP appears on frames 1, 4, 7, etc, this field would be set to '3'. For PLPs which appear in every frame, this field can be set to '1'. For further details, see DVB-T2/NGH specification.

PAIRWISE_TI_FLAG: this x-bit field indicates whether a pairwise time interleaving is used or not, especially for QPSK and 16QAM modulations. In other words, this field indicates whether cell-to-MU mapping/demapping has been performed, and therefore, can be used to indicate whether each MU consists of two cells or a single cell.

PAIRWISE_TI_information may be called L1D_TI_extended_interleaving information. TI_extended_interleaving information can be signaled through a one bit field to indicate whether extended interleaving has been applied to this PLP. If the field value is 1, it indicates that extended interleaving has been used. This field can be signaled by the value of 1 only when QPSK scheme is used for modulation of the PLP. Extended interleaving refers to the method for carrying out cell grouping described in this document; in case extended interleaving is used, cell coupling/cell decoupling can be carried out. FIG. 40 illustrates the case where pairwise TI flag information, namely, TI extended interleaving information is included in the configurable signaling information; however, the pairwise TI flag information is included in a preamble and depending on embodiments, may be included in a dynamic signaling part.

FIG. 41 illustrates TI signaling information according to another embodiment of the present invention.

FIG. 41 illustrates TI signaling information included in a dynamic signaling part of a broadcast signal, where the TI signaling information can be varying within a super-frame. At least one of the signaling information shown in FIG. 41 can correspond to or be included in the TI signaling information.

TI signaling information included in the configurable signaling part may be classified into S-PLP mode and M-PLP mode according to the number of PLPs. TI_START_ROW information, TI_FECBLOCK_IDX information, and TI_FECBLOCK_START information are the signaling information required to operate S_PLP mode CI. PLP_NUM_BLOCKS information is the signaling information required to operate M-PLP mode TI. FRAME_INTERVAL information and PAIRWISE_TI_FLAG information can be applied to both of the S-PLP and M-PLP modes. Each field (signaling information) will be described later.

TI_START_ROW: this x-bit field indicates the position of the deinterleaver commutator (or switch/selector) at the start of the frame.

TI_FECBLOCK_START: this x-bit field indicates the start position of the first complete FEC block.

TI_FECBLOCK_IDX: this x-bit field indicates the ID of the starting FEC block for cell deinterleaving after the initial Convolutional DeInterleaving (CDI). The ID of the starting FEC block on each frame may change dynamically.

PLP_NUM_BLOCKS: this x-bit field indicates the number of FEC blocks for the current PLP in each ATSC 3.0 signal frame.

Figure 42:
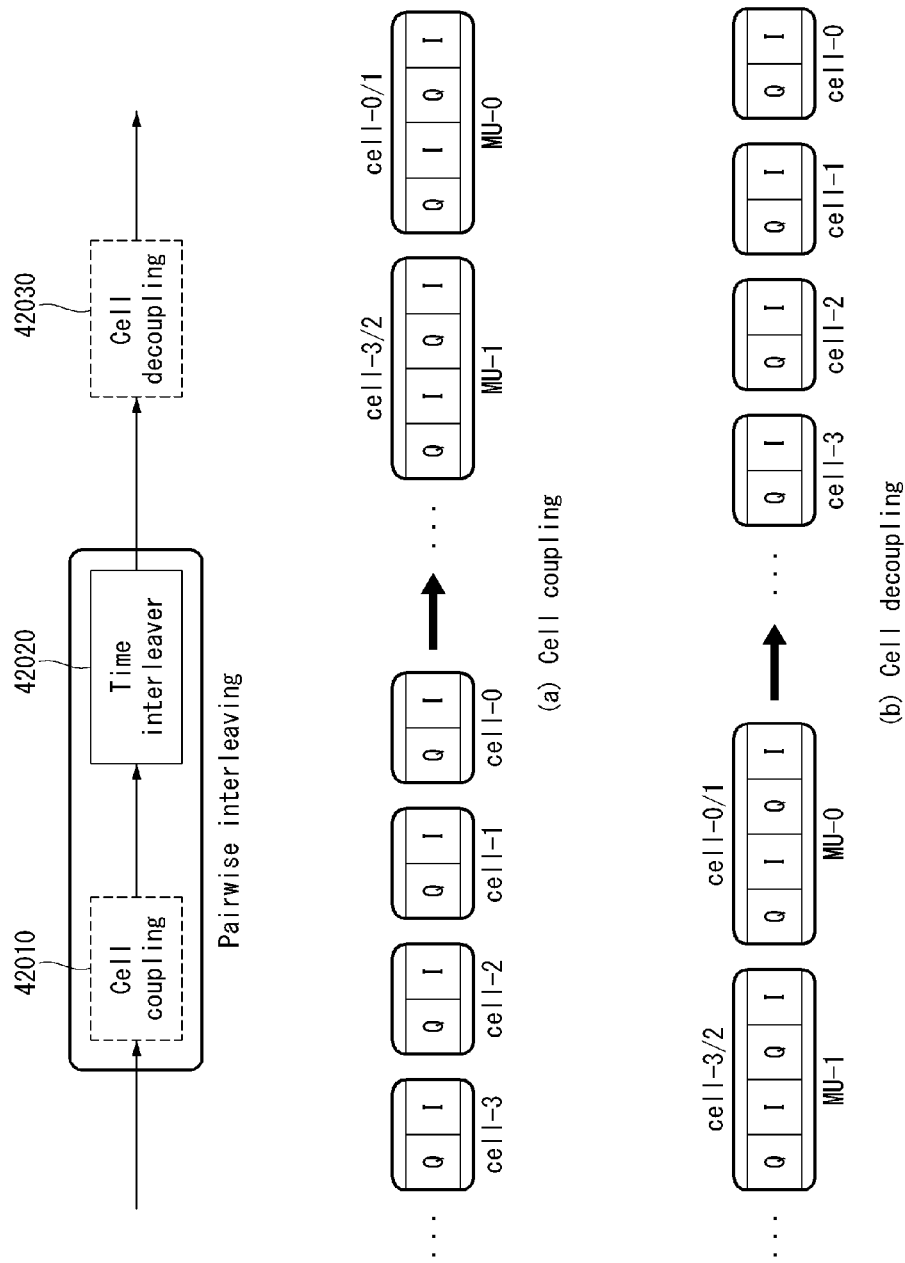
FIG. 42 illustrates a time interleaving method according to one embodiment of the present invention.

FIG. 42 illustrates a time interleaving method according to one embodiment of the present invention.

FIG. 42 is an embodiment additional to FIG. 32, and the time interleaver of FIG. 42 comprises a cell decoupling block 42030 in addition to the cell coupling block 42010 and the time interleaver 42020. The cell coupling block 42010 corresponds to the cell grouping block described above, and the cell decoupling block 42030 can be referred to as a cell degrouping block in what follows. And the time interleaver 42020 of FIG. 42 represents CI in the case of S-PLP mode and twisted BI and CI in the case of M-PLP mode.

The cell decoupling block 42010 groups two consecutive cells into one MU before time interleaving is applied. As shown in FIG. 42(a), the cell coupling block 42010 receives cells including in-phase component and quadrature-phase component (cell-0, cell-1, . . . , and so on) and maps every two consecutive cells to one memory unit (MU-1, MU-2, and so on).

The cell decoupling block 42030, which splits time interleaved MUs into two individual cells, performs the inverse operation of cell coupling. The cell decoupling block 42030 decouples the cells included in the memory units (MU-1, MU-2, and so on) into separate cells (cell-0, cell-1, cell-2, and so on).

In case pairwise interleaving is used, it can be regarded that the extended interleaving mode is used, which can be signaled by using PAIRWISE_TI_FLAG information. If PAIRWISE_TI_FLAG is 0, it indicates pairwise interleaving OFF mode, while, if PAIRWISE_TI_FLAG is 1, indicates pairwise interleaving ON mode. As described above, pairwise interleaving may be used only when QPSK scheme is used for modulation.

Figure 43:
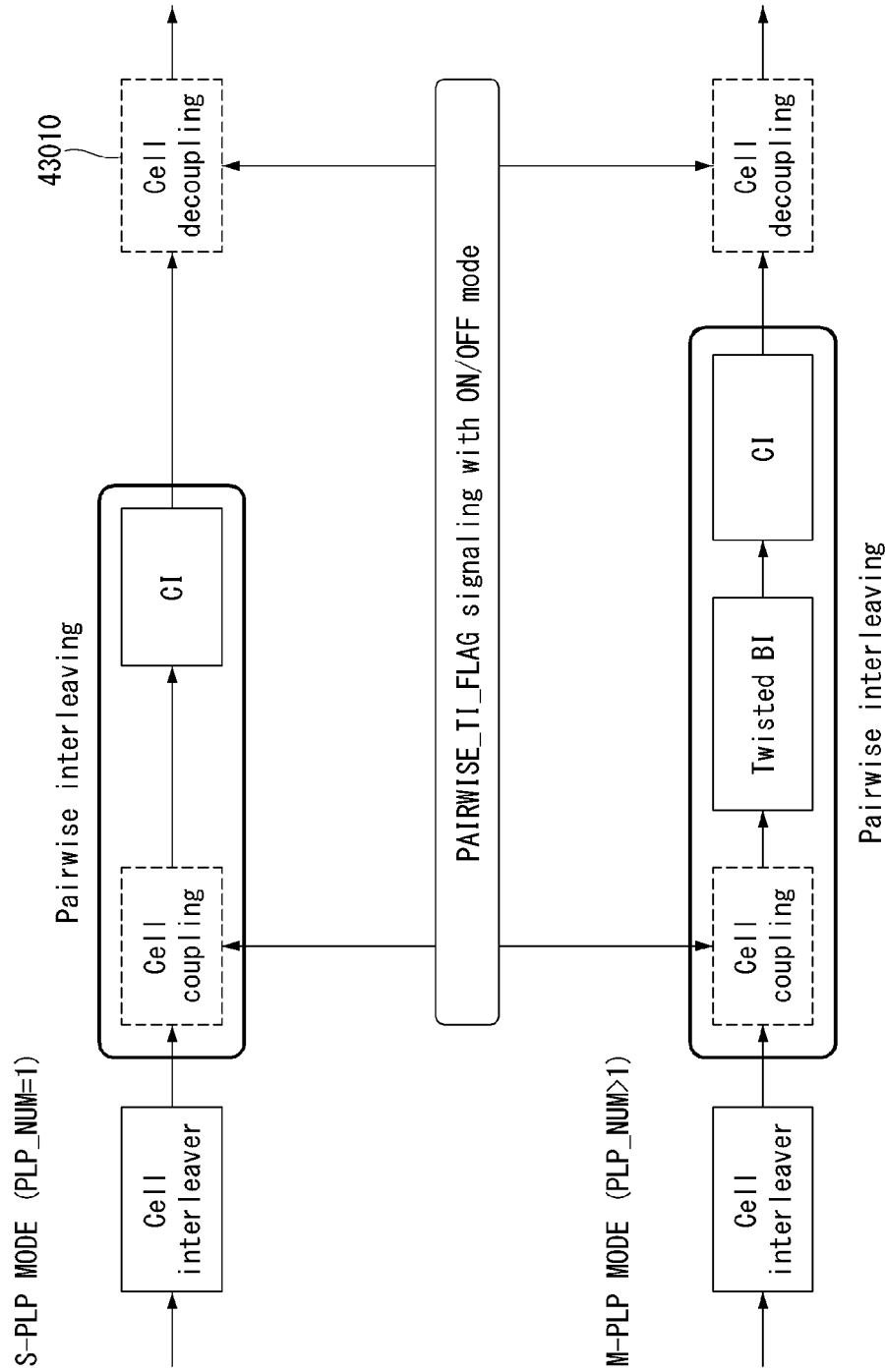
FIG. 43 illustrates a time interleaving block of a broadcast signal transmitter.
Figure 44:
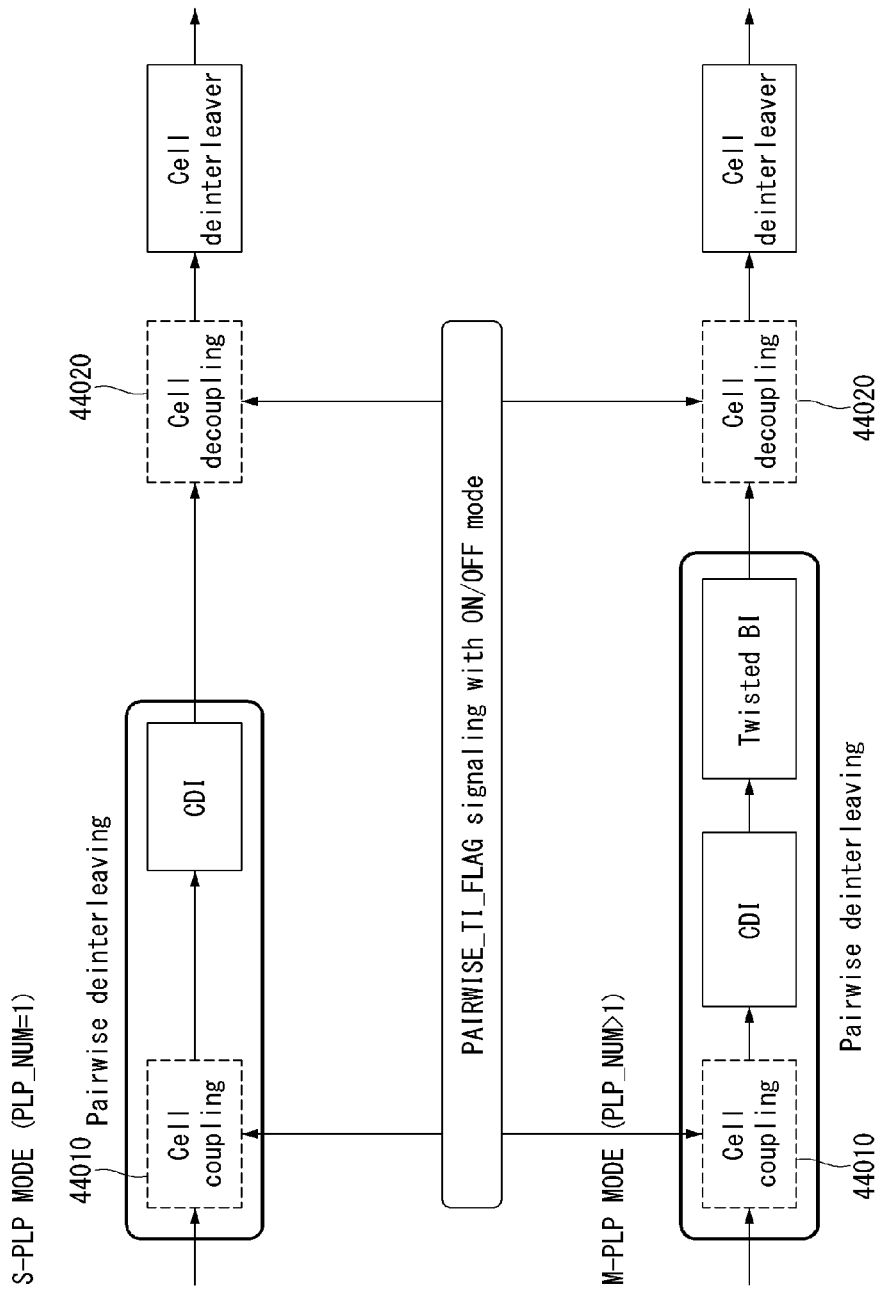
FIG. 44 illustrates a time deinterleaving block of a broadcast signal receiver.

FIG. 43 illustrates a time interleaving block of a broadcast signal transmitter, and FIG. 44 illustrates a time deinterleaving block of a broadcast signal receiver.

Descriptions about the time interleaver of FIG. 43 and the time deinterleaver of FIG. 44 are similar to the descriptions given in conjunction with FIG. 32 and FIGS. 37 to 39. However, FIG. 43 additionally illustrates a cell decoupling block 43010, while, in the case of FIG. 44, a cell coupling block 44010 is additionally illustrated.

First of all, except for the cell decoupling block 43010, descriptions about the other components of FIG. 43 are the same as given previously. The cell decoupling block 42010 can split two cells mapped to an MU into individual cells, and the framing/interleaving block can perform framing in units of cells.

Descriptions about FIG. 44 are the same as give above except for the cell coupling block 44010. In case PAIRWISE_TI_FLAG is 1, the time deinterleaver can perform pairwise deinterleaving by using the cell coupling block 44010 and the cell decoupling block 44020. On the other hand, if PAIRWISE_TI_FLAG is 0, the time deinterleaver can perform single-wise deinterleaving by turning off or bypassing the cell coupling block 44010 and the cell decoupling block 44020. As described above, pairwise deinterleaving can be called extended deinterleaving.

The cell coupling block 44010 of the time deinterleaver of the receiver can perform the same operation as described with respect to the cell coupling block 44010 and perform deinterleaving as an inverse process performed by the transmitter with respect to cell-coupling MU units.

Figure 45:
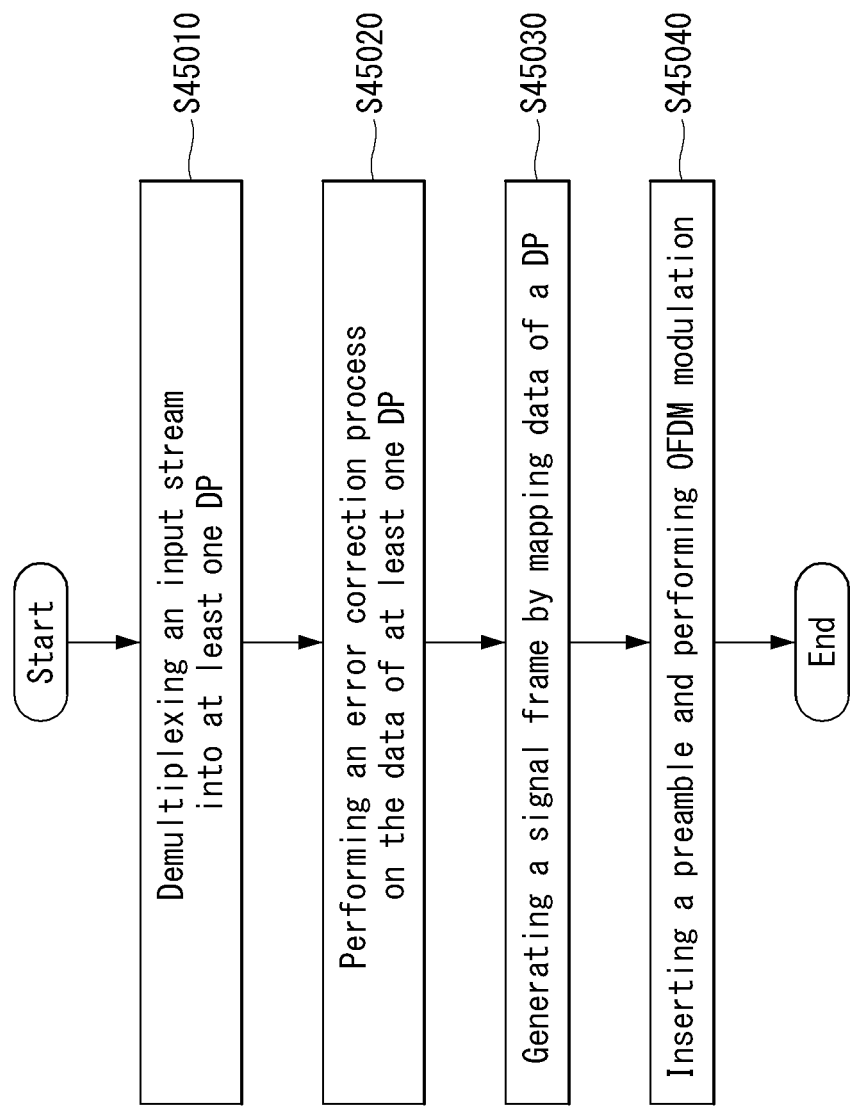
FIG. 45 illustrates a method for transmitting a broadcast signal of a broadcast signal transmitter according to one embodiment of the present invention.

FIG. 45 illustrates a method for transmitting a broadcast signal of a broadcast signal transmitter according to one embodiment of the present invention.

As described with respect to the broadcast signal transmitter and the operation thereof, the broadcast signal transmitter can demultiplex an input stream into at least one Data Pipe (DP), namely, a Physical Layer Pipe (PLP) by using an input formatting module S45010. In other words, the broadcast signal transmitter can output at least one PLP data by carrying out baseband formatting on the input data by using the input formatting module. And the broadcast signal transmitter can perform error correction processing or FEC encoding on the data included in at least one DP (PLP) by using the BICM module S45020. The broadcast signal transmitter can perform interleaving on at least one PLP data by using the framing and interleaving module and generate a signal frame by mapping the interleaved data S45030. The broadcast signal transmitter can insert a preamble into a transmission signal and perform OFDM modulation on the transmission signal by using the waveform generating module 545040.

The framing and interleaving module further comprises a time interleaving module which performs time interleaving on at least one PLP data. In other words, the interleaving and generating a signal frame of the broadcast signal transmitter further comprises performing time interleaving on at least one PLP data.

The time interleaving module further comprises a cell-to-memory unit mapping module which maps at least one PLP cells into memory units. In other words, the performing time interleaving further comprises mapping two consecutive cells to one/individual memory units in case the time interleaver operates in the extened interleaving mode. The operation in the extended interleaving mode can be carried out selectively when the PLP data are modulated according to the QPSK scheme.

As described above, the preamble can include TI signaling information. The TI signaling information can include TI extended interleaving information to indicate whether the extended interleaving mode has been used for the PLP data.

Also, the time interleaving module can further comprises a memory unit-to-cell demapping module which demaps cells included in a memory unit. In other words, the performing time interleaving can demap a memory unit to which two cells have been mapped into individual cells in case the time interleaving module operates in the extended interleaving mode.

FIG. 46 illustrates a method for receiving a broadcast signal of a broadcast signal receiver according to one embodiment of the present invention.

As described with respect to the broadcast signal receiver and the operation thereof, the broadcast signal receiver can perform signal detection and OFDM demodulation on a received broadcast signal by using a synchronization/demodulation module S46010. The broadcast signal receiver can parse and deinterleave a signal frame of a received broadcast signal by using the frame parsing and deinterleaving module 546020. The broadcast signal receiver can convert service data extracted from a received broadcast signal into the bit domain and perform FEC decoding on the converted service data by using the demapping and decoding module 546030. And the broadcast signal receiver can output processed service data in the form of a data stream by using the output processing module S46040. As described above, the broadcast signal receiver can process at least one PLP data included in a broadcast signal.

The frame parsing and deinterleaving module further comprises a time deinterleaving module which performs time deinterleaving on at least one PLP data. In other words, the performing frame parsing and deinterleaving of the broadcast signal receiver further comprises performing time deinterleaving on at least one PLP data.

The time deinterleaving module further comprises a cell-to-memory unit mapping module which maps at least one PLP cell into a memory unit. In other words, the performing time deinterleaving further comprises mapping two consecutive cells to one/individual memory units in case the time deinterleaver operates in the extended deinterleaving mode. The operation in the extended deinterleaving mode can be carried out selectively when the PLP data are modulated according to the QPSK scheme, namely, when the PLP data are demodulated according to the QPSK scheme.

As described above, the preamble can include TI signaling information. The TI signaling information can include TI extended interleaving information which indicates whether the extended interleaving mode has been applied to the PLP data. The broadcast signal receiver can perform time deinterleaving in the extended deinterleaving mode according to the TI extended interleaving information. In other words, in case the broadcast signal receiver processes one PLP and the time deinterleaving module operates in the extended deinterleaving mode, the convolutional deinterleaving module can perform deinterleaving in units of MUs, each of which comprises two cells. On the other hand, in case the broadcast signal receiver processes multiple PLPs and the time deinterleaving module operates in the extended deinterleaving mode, the block deinterleaving module and the second convolutional deinterleaving module can perform deinterleaving in units of MUs, each of which comprises two cells.

The time deinterleaving module further comprises a memory unit-to-cell demapping module which demaps the memory units into at least one PLP cell. In other words, in case the time deinterleaving module operates in the extended deinterleaving mode, the performing time interleaving further comprises demapping two consecutive cells mapped to one memory unit into individual cells.

According to the present invention, as a plurality of cells are mapped to one memory unit to carry out interleaving, interleaving depth is increased and interleaving performance is improved. However, such extended interleaving/deinterleaving requires a large memory size and may cause a delay depending on the processing capabilities of a transmitter and a receiver. Therefore, if the extended interleaving/deinterleaving is made to be performed selectively according to the performance of the transmitter and the receiver; and the transmitter signals whether the extended interleaving is performed or not, the receiver can perform the extended deinterleaving selectively according to signaling information. The present invention can provide the aforementioned signaling information and optimize the usage and performance of a memory and a processor through selective cell-to-memory mapping. Also, since the mapped memory units are again demapped to cell units, data can be processed again in units of cells after the time interleaver/deinterleaver, and memory usage and system performance can be optimized.

It should be clearly understood by those skilled in the art that various modifications and changes of the present invention can be made without leaving the technical principles and scope of the present invention. Therefore, it should be understood that the present invention includes the modifications and changes of the present invention supported by the appended claims and their equivalents.

This document describes all of the apparatus and methods related to the present invention, and descriptions thereof can be applied in a complementary manner.

What is claimed is:

1. A broadcast signal transmitter, comprising:
a Forward Error Correction (FEC) encoder to perform FEC encoding on Physical Layer Pipe (PLP) data;
a bit interleaver to perform bit interleaving on the FEC encoded PLP data;
a constellation mapper to perform constellation mapping on the bit interleaved PLP data;
a time interleaver to time-interleave the constellation mapped PLP data;
a framer to generate a signal frame including signaling information and the time interleaved PLP data, the signaling information providing information to configure physical layer parameters;
an Inverse Fast Fourier Transform (IFFT) modulator to perform Orthogonal Frequency Division Multiplexing (OFDM) modulation on the generated signal frame; and
a transmitter to transmit a broadcast signal including the OFDM modulated signal frame to a receiver;
wherein the signaling information includes TI (Time Interleaver) extended interleaving information indicating whether the time interleave operates in an extended interleaving mode, and the extended interleaving mode increases time interleaving depth by controlling a TI memory,
wherein the time interleaver further comprises a cell-to-memory unit mapper to map cells of the PLP data to memory units of the TI memory and
the cell-to-memory unit mapper maps two consecutive cells to each memory unit when the time interleaver operates in the extended interleaving mode.

2. The broadcast signal transmitter of claim 1, wherein the time interleaver optionally operates in the extended interleaving mode when modulation type for the PLP data is Quadrature Phase Shift Keying (QPSK).

3. The broadcast signal transmitter of claim 2, wherein the signaling information includes modulation information indicating the modulating type for the PLP data.

4. The broadcast signal transmitter of claim 2, wherein the time interleaver performs convolutional interleaving in a first interleaving mode and performs convolutional interleaving and twisted block interleaving in a second interleaving mode.

5. The broadcast signal transmitter of claim 1, wherein the time interleaver further comprises a memory unit-to-cell demapper configured to demap cells included in the memory units of the TI memory and
wherein the memory unit-to-cell demapper demaps the each memory unit to the two consecutive cells when the time interleaver operates in the extended interleaving mode.

6. A method for transmitting a broadcast signal, comprising:
performing a Forward Error Correction (FEC) encoding on Physical Layer Pipe (PLP) data;
performing bit interleaving on the FEC encoded PLP data;
performing constellation mapping on the bit interleaved PLP data;
time interleaving the constellation mapped PLP data;
generating a signal frame including signaling information and the time interleaved PLP data, the signaling information providing information to configure physical layer parameters;
performing Orthogonal Frequency Division Multiplexing (OFDM) modulation on the generated signal frame; and
transmitting a broadcast signal including the OFDM modulated signal frame to a receiver,
wherein the signaling information includes TI (Time Interleaver) extended interleaving information indicating whether the time interleaving is performed in an extended interleaving mode, and the extended interleaving mode increase time interleaving depth by controlling a TI memory,
wherein the time interleaving further comprises cell-to-memory unit mapping for mapping cells of the PLP data to memory units of the TI memory and
the cell-to-memory unit mapping is performed by mapping two consecutive cells to each memory unit when the time interleaving is performed in the extended interleaving mode.

7. The method of claim 6, wherein the time interleaving is optionally performed in the extended interleaving mode when modulation type for the PLP data is Quadrature Phase Shift Keying (QPSK).

8. The method of claim 7, wherein the signaling information includes modulation information indicating the modulating type for the PLP data.

9. The method of claim 7, wherein the time interleaving further comprises convolutional interleaving in a first interleaving mode and comprises convolutional interleaving and twisted block interleaving in a second interleaving mode.

10. The method of claim 6, wherein the time interleaving further comprises a memory unit-to-cell demapping for demapping the cells included in the memory units of the TI memory and
the memory unit-to-cell demapping is performed by demapping the each memory unit to the two consecutive cells when the time interleaving is performed in the extended interleaving mode.

* * * * *